US009379347B2

(12) United States Patent
Nakayama

(10) Patent No.: US 9,379,347 B2
(45) Date of Patent: Jun. 28, 2016

(54) ORGANIC ELECTROLUMINESCENCE ELEMENT

(71) Applicant: Konica Minolta, Inc., Tokyo (JP)

(72) Inventor: Tomoyuki Nakayama, Tokyo (JP)

(73) Assignee: Konica Minolta, Inc., Tokyo (JP)

(*) Notice: Subject to any disclaimer, the term of this patent is extended or adjusted under 35 U.S.C. 154(b) by 19 days.

(21) Appl. No.: 14/424,143

(22) PCT Filed: Jul. 26, 2013

(86) PCT No.: PCT/JP2013/070355
§ 371 (c)(1),
(2) Date: Feb. 26, 2015

(87) PCT Pub. No.: WO2014/034341
PCT Pub. Date: Mar. 6, 2014

(65) Prior Publication Data

US 2015/0243921 A1 Aug. 27, 2015

(30) Foreign Application Priority Data

Aug. 27, 2012 (JP) ................................ 2012-186502

(51) Int. Cl.

| | |
|---|---|
| ***H01L 23/58*** | (2006.01) |
| ***H01L 51/50*** | (2006.01) |
| ***H01L 51/52*** | (2006.01) |

(52) U.S. Cl.
CPC ........ *H01L 51/5044* (2013.01); *H01L 51/5278* (2013.01)

(58) Field of Classification Search
CPC ................. H01L 2251/5315; H01L 2251/552; H01L 2251/558; H01L 27/3209; H01L 27/3225; H01L 51/442; H01L 51/50; H01L 51/5012; H01L 51/5016; H01L 51/504; H01L 51/5048; H01L 51/5056; H01L 51/5084; H01L 51/5088; H01L 51/5092; H01L 51/5096; H01L 51/5206; H01L 51/5215; H01L 51/5218; H01L 51/5221; H01L 51/5234; H01L 51/5262; H01L 51/5271; H01L 51/5296
USPC ............ 257/40, 642, 759, E25.008, E39.007, 257/E51.018, E51.022, E51.024, E51.026
See application file for complete search history.

(56) References Cited

U.S. PATENT DOCUMENTS

| | | | |
|---|---|---|---|
| 6,337,492 | B1 | 1/2002 | Jones et al. |
| 7,830,089 | B2 | 11/2010 | Murano et al. |

(Continued)

FOREIGN PATENT DOCUMENTS

| | | | |
|---|---|---|---|
| JP | 2003-264085 | A | 9/2003 |
| JP | 2006-049393 | A | 2/2006 |

(Continued)

OTHER PUBLICATIONS

International Search Report issued in corresponding International Appln. PCT/JP2013/070355, mailed Sep. 10, 2013 (7 pages).

(Continued)

*Primary Examiner* — Kyoung Lee
*Assistant Examiner* — Joannie A Garcia
(74) *Attorney, Agent, or Firm* — Osha Liang LLP

(57) ABSTRACT

An organic electroluminescence element includes at least one intermediate metal layer and at least two light emitting units between an anode and a cathode. The intermediate metal layer is located between the two light emitting units. Further, the intermediate metal layer is made of a metal with a work function of 3.0 eV or lower, and has a thickness of 0.6 to 5 nm.

14 Claims, 2 Drawing Sheets

(56) References Cited

U.S. PATENT DOCUMENTS

| | | | | |
|---|---|---|---|---|
| 2006/0289882 | A1* | 12/2006 | Nishimura | C09K 11/06 257/94 |
| 2012/0007064 | A1* | 1/2012 | Noh | H01L 51/0058 257/40 |

FOREIGN PATENT DOCUMENTS

| | | | |
|---|---|---|---|
| JP | 3884564 | B2 | 2/2007 |
| JP | 2007-149605 | A | 6/2007 |
| JP | 2007-179933 | A | 7/2007 |
| JP | 2007-533073 | A | 11/2007 |
| JP | 4315874 | B2 | 8/2009 |
| JP | 2010-003652 | A | 1/2010 |
| JP | 2010-192472 | A | 9/2010 |
| JP | 4570014 | B2 | 10/2010 |
| JP | 2011-040437 | A | 2/2011 |
| WO | 2006/075822 | A1 | 7/2006 |

OTHER PUBLICATIONS

Written Opinion issued in corresponding International Appln. PCT/JP2013/070355, mailed Sep. 10, 2013 (7 pages).

* cited by examiner

ORGANIC ELECTROLUMINESCENCE ELEMENT

TECHNICAL FIELD

The present invention relates to organic electroluminescence elements.

BACKGROUND ART

In general, an organic electroluminescence element (an organic EL element) has a fundamental layer structure formed with an anode, an organic light emission layer, and a cathode, and is completed by adding layers such as a hole injection layer, a hole transport layer, an electron transport layer, and an electron injection layer to the layer structure as appropriate.

In an organic EL element having such a structure, it is known that there is normally a trade-off relationship between luminous current efficiency and operating life. So as to improve the trade-off relationship, various studies have been made on organic materials, organic layer structures, element drive methods, and the like.

From the viewpoint of an organic layer structure, a so-called tandem structure has been suggested as a technique for fundamentally improving the trade-off relationship. In a tandem structure, a group of luminescent functional layers formed with one or more layers including a light emission layer made of at least an organic material is regarded as one light emitting unit, and such light emitting units are stacked via an intermediate layer, so that the operating life can be prolonged while luminescent current efficiency is maintained, or luminescent current efficiency is dramatically increased without substantially shortening the operating life.

Intermediate layers in such tandem structures are disclosed in Patent Literatures 1 to 7 described below.

"Patent Literature 1" discloses a structure that has two conductive layers between OLED layers, and specifically discloses a stack structure formed with a Mg—Ag alloy film and an ITO film, and the like.

"Patent Literature 2" discloses an intermediate conductive layer formed with at least two layers, and specifically discloses a stack structure formed with an 8-nm thick Mg—Ag alloy film and a 10-nm thick In—Zn—O conductive film, and the like.

"Patent Literature 3" discloses a technique for achieving conductivity by doping a floating thin conductor layer containing an organic compound with an acceptor or a donor.

"Patent Literature 4" and "Patent Literature 5" also disclose intermediate layers formed by stacking organic layers doped with an acceptor and a donor.

"Patent Literature 6" discloses a structure in which a metal layer (an internal electrode) with a work function of 4.5 eV or lower is inserted between light emitting units, and "Patent Literature 7" discloses a similar structure in the description of embodiments.

However, the demand for increases in the performance and the productivity of an organic EL element is becoming more and more difficult.

For example, in the structures disclosed in "Patent Literature 1" and "Patent Literature 2", two conductive layers needs to be stacked, and the film formation process differs from the film formation process for an organic EL element normally formed by a vapor deposition method or a coating method, since the ITO film and the In—Zn—O film disclosed as embodiments need to be formed by a sputtering method. For these reasons, the load is too large in terms of production efficiency. Also, in a case where such conductive layers are formed on an organic material by a sputtering method, damage to the organic film cannot be ignored.

With the methods using doped layers described in "Patent Literature 3", "Patent Literature 4", and "Patent Literature 5", the process load can be made smaller than that in "Patent Literature 1" and "Patent Literature 2". However, performance varies depending on doping density, and therefore, it is difficult to secure production stability. Further, there is a high risk of performance degradation due to diffusion of a doping material into the respective layers constituting the light emitting units. Therefore, such organic EL elements in use for many years have a possibility of accelerated performance degradation.

A structure in which one metal layer is inserted between light emitting units as described in "Patent Literature 6" and "Patent Literature 7" has relatively low process load, and have a low possibility of performance variation due to material diffusion, compared with the structures disclosed in "Patent Literature 1" and "Patent Literature 2".

Specifically, although a 6-nm thick structure using Al (work function: approximately 4.3 eV) is disclosed in the description of embodiments in "Patent Literature 6", the drive voltage remains high only with the Al layer, and an electron injection layer adjacent to the anode side of the metal layer becomes necessary. A structure in which LiF is used as an electron injection layer material is actually disclosed. As a result, one inorganic layer needs to be inserted, and the production load increases. Also, it is considered that the two-layer structure formed with LiF and Al substantially realizes the functions of an intermediate layer. Furthermore, the metal layer is thick, having a thickness of 6 nm. Therefore, preservation stability and drive stability are not ideal, and there is also decrease in efficiency due to absorption by the metal layer.

A structure using a 0.3-nm thick Li layer as a metal layer (an intermediate unit) is disclosed in the description of embodiments in "Patent Literature 7". However, the thickness of the metal layer is only approximately 0.3 nm. Therefore, it has become clear that the organic EL element does not exhibit stable performance, or there is large performance variation particularly in the initial stage of operation or during a relatively short period of time after the preparation of the element.

CITATION LIST

Patent Literatures

Patent Literature 1: U.S. Pat. No. 6,337,492
Patent Literature 2: JP 3884564 B1
Patent Literature 3: JP 2003-264085 A
Patent Literature 4: JP 4570014 B1
Patent Literature 5: U.S. Pat. No. 7,830,089
Patent Literature 6: JP 2007-533073 W
Patent Literature 7: JP 4315874 B1

SUMMARY OF INVENTION

One or more embodiments of the present invention provide an organic EL element that is formed with stacked light emitting units, functions with a low drive voltage, excels in luminous efficiency and preservation stability, and realizes higher productivity. The present invention further aims to provide an organic EL element that emits white light.

According to one or more embodiments, an organic EL element includes at least one intermediate metal layer and at least two light emitting units between an anode and a cathode, the intermediate metal layer being located between the two light emitting units, the intermediate metal layer being made of a metal with a work function of 3.0 eV or lower and having a thickness of 0.6 to 5 nm. Thus, the inventors have reached the present invention.

Further details in accordance with one or more embodiments are described below.

1. An organic electroluminescence element including at least one intermediate metal layer and at least two light emitting units between an anode and a cathode, the intermediate metal layer being located between the two light emitting units, wherein the intermediate metal layer is made of a metal with a work function of 3.0 eV or lower, and has a thickness of 0.6 to 5 nm.

2. The organic electroluminescence element of Item. 1, wherein at least one of surfaces of the intermediate metal layer is a non-flat surface, the surfaces facing the light emitting units.

3. The organic electroluminescence element of Item. 1 or 2, wherein a layer adjacent to the anode side of the intermediate metal layer is formed with a single organic compound.

4. The organic electroluminescence element of Item. 1 or 2, wherein a layer adjacent to the anode side of the intermediate metal layer is formed by forming a film of a single organic compound.

5. The organic electroluminescence element of any one of Items. 1 to 4, wherein a stack structure is formed with the intermediate metal layer and the light emitting unit, the layer structure and the materials forming respective layers in the stack structure are the same as the layer structure and the materials forming respective layers in another light emitting unit or another stack structure adjacent to the intermediate metal layer side of the stack structure, except for a light emission layer.

6. The organic electroluminescence element of any one of Items. 1 to 5, which emits white light.

Advantageous Effects of Invention

With the above means of the present invention, it is possible to provide an organic EL element that is formed with stacked light emitting units, functions with a low drive voltage, excels in luminous efficiency and preservation stability, and realizes higher productivity. Further, it is also possible to provide an organic EL element that emits white light.

DESCRIPTION OF EMBODIMENTS

Figure 1:
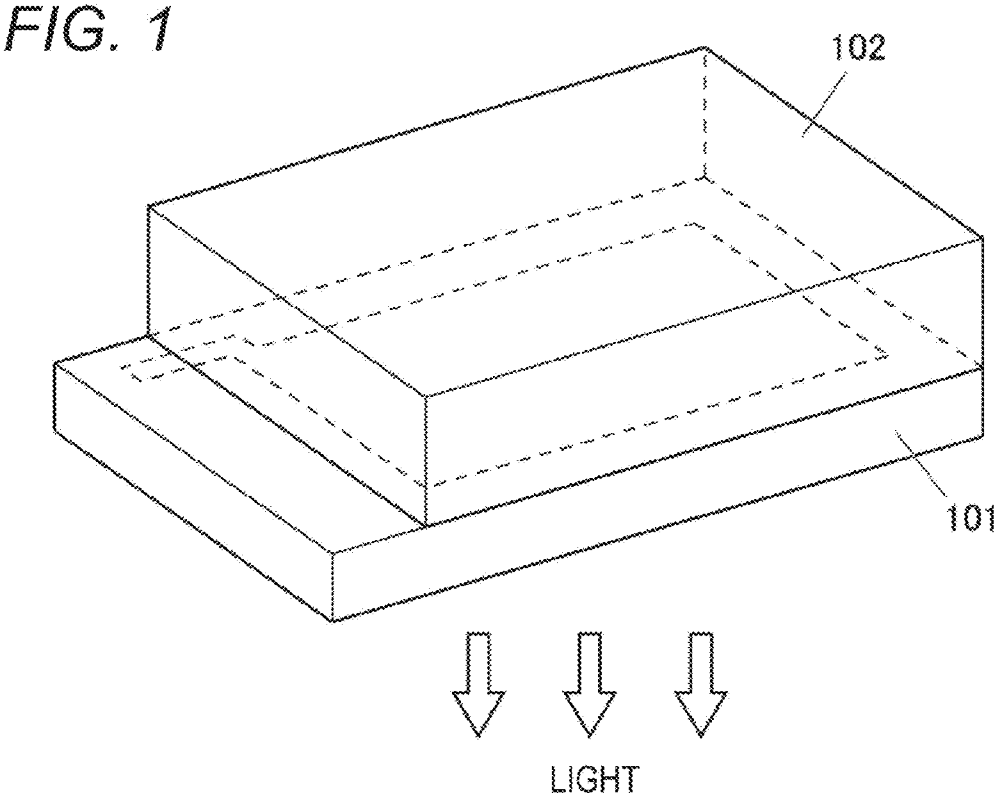
FIG. 1 is a schematic view of an example of a lighting device into which an organic EL element of the present invention is incorporated.

An organic EL element of the present invention characteristically includes at least one intermediate metal layer and at least two light emitting units between an anode and a cathode, the intermediate metal layer being located between the two light emitting units. The intermediate metal layer is made of a metal with a work function of 3.0 eV or lower, and has a thickness of 0.6 to 5 nm.

So as to achieve higher preservation stability (inhibition of sudden death), an intermediate metal layer having at least one non-flat surface is more preferable than an intermediate metal layer with completely flat surfaces. If the intermediate metal layer has one non-flat surface, current does not easily flow in the in-plane direction, and current concentration at thinner film portions caused by uneven thickness of the organic layer due to variation in thickness in the substrate, and short-circuit faults and the like accompanying such current concentration can be desirably restrained.

Also, the layer adjacent to the anode side of the intermediate metal layer is a layer formed through formation of a film of a single organic compound. This is preferable, not only because the production process involving the film formation with a single organic material is simpler, the process control is easier, and the risk of performance variation is avoided, but also because higher long-term or high-temperature preservation stability and long-term drive stability can be achieved.

Furthermore, in a case where a stack structure is formed with one intermediate metal layer and one light emitting unit in the present invention, so as to achieve high production efficiency and stability, the layer structure and the materials forming the respective layers in the stack structure are preferably the same as the layer structure and the materials forming the respective layers in another light emitting unit or another stack structure adjacent to the intermediate metal layer side of the stack structure, except for the light emission layer.

In each of the light emitting units in the present invention, a phosphorescence emission material and a fluorescence emission material are not mixed, and each light emitting unit is preferably formed only with a phosphorescence emission material or only with a fluorescence emission material, so as to prevent luminous efficiency loss. This is because, if a phosphorescence emission material and a fluorescence emission material are mixed in a single light emitting unit, energy transfer between the phosphorescence emission material and the fluorescence emission material, and luminous efficiency loss due to quenching will easily occur.

Further, white light emission is preferably realized in the present invention.

An organic EL element of the present invention can be suitably included in a lighting device.

The following is a detailed description of the present invention, the components thereof, and the modes and embodiments for carrying out the present invention. In this specification, "to" as in "A to B" is used where the numerical values before and after the "to" are included as the lower limit value and the upper limit value.

<<Layer Structures of Organic EL Elements>>

Although preferred specific examples of layer structures of organic EL elements of the present invention will be described below, the present invention is not limited to them.

(I) Anode/first light emitting unit/intermediate metal layer/second light emitting unit/cathode, (II) anode/first light emitting unit/first intermediate metal layer/second light emitting unit/second intermediate metal layer/third light emitting unit/cathode, and (III) anode/first light emitting unit/first intermediate metal layer/second light emitting unit/second intermediate metal layer/third light emitting unit/third intermediate metal layer/fourth light emitting unit/cathode (I-1) Anode/white light emitting unit/intermediate metal layer/white light emitting unit/cathode, (I-2) anode/blue light emitting unit/intermediate metal layer/green or red light emitting unit/cathode, (I-3) anode/green or red light emitting unit/intermediate metal layer/blue light emitting unit/cathode, (II-1) anode/blue light emitting unit/first intermediate metal layer/blue light emitting unit/second intermediate metal layer/green or red light emitting unit/cathode, (II-2) anode/blue light emitting unit/first intermediate metal layer/green light emitting unit/second intermediate metal layer/red light emitting unit/cathode, and (II-3) anode/green light emitting unit/first intermediate metal layer/red light emitting unit/second intermediate metal layer/blue light emitting unit/cathode In the present invention, the number of light emitting units is not particularly limited as long as it is 2 or greater. In view of production efficiency, however, the number of light emitting units is preferably 2 to 10, and more preferably, 2 to 4. Where the number of light emitting units is N (N being an integer of 2 or greater), the number of intermediate metal layers is N−1 in the present invention.

Although preferred specific examples of layer structures of light emitting units will be described below, the present invention is not limited to them.

(i) Hole injection transport layer/light emission layer/electron injection transport layer, (ii) hole injection transport layer/first light emission layer/second light emission layer/electron injection transport layer, (iii) hole injection transport layer/first light emission layer/intermediate layer/second light emission layer/electron injection transport layer, (iv) hole injection transport layer/light emission layer/hole inhibition layer/electron injection transport layer, (v) hole injection transport layer/electron inhibition layer/light emission layer/hole inhibition layer/electron injection transport layer, (vi) hole injection layer/hole transport layer/light emission layer/electron transport layer/electron injection layer, (vii) hole injection layer/hole transport layer/light emission layer/hole inhibition layer/electron transport layer/electron injection layer, (viii) hole injection layer/hole transport layer/electron inhibition layer/light emission layer/hole inhibition layer/electron transport layer/electron injection layer In the present invention, each layer can be formed by a known thin-film forming method such as a vacuum deposition method, a spin coat method, a cast method, a LB method (Langmuir-Blodgett method), an ink jet method, a spray method, a printing method, or a slot-type coater method.

In the present invention, a phosphorescence emission material and a fluorescence emission material may coexist in a light emission layer in a light emitting unit, but a light emission layer is preferably formed only with a phosphorescence emission material or only with a fluorescence emission material.

In the present invention, a fluorescence emission layer and a phosphorescence emission layer are preferably host- or dopant-type light emission layers.

An emission dopant contained in a light emission layer may be contained at a uniform density in the thickness direction of the light emission layer, or may have a density distribution.

In the present invention, a combination of light emitting units with different structures may be used. However, except for the light emission layers forming the light emitting units, the light emitting units preferably have structures using the same layers and the same material, and further, the number of light emitting units is preferably the same between the light emitting units. In this case, the number of materials to be used can be reduced in production, and advantages can be achieved in terms of cost and quality control. Furthermore, if a vapor deposition process is employed, a film forming chamber can easily be used for the respective light emitting units, and advantages in terms of production efficiency can also be achieved.

For the above reasons, all the layers including light emission layers preferably have the same structures and are made of the same materials in a case where white light emitting units are stacked.

In a case where white light emission is to be realized by stacking light emitting units that emit light in different colors, the colors of these light emitting units are preferably complementary to each other. For example, an organic EL element that emits white light can be formed by setting a blue light emitting unit and a light emitting unit that emits light in a complementary color such as yellow-green, yellow, or orange.

A "complementary" relationship is a relationship between colors that provide achromatic color when mixed. That is, white light emission can be realized by mixing rays of light emitted from substances that emit light in colors complementary to each other.

As white light emission with high color rendering properties is realized, and a wider range of chromaticity can be readily adjusted, a layer that emits light in green or red, as well as a blue light emission layer, is preferably set in one of the light emitting units.

Also, a light emission layer that emits white light may be formed by mixing blue, green, and red light emission materials in one light emission layer, and be set in a light emitting unit.

Figure 4:
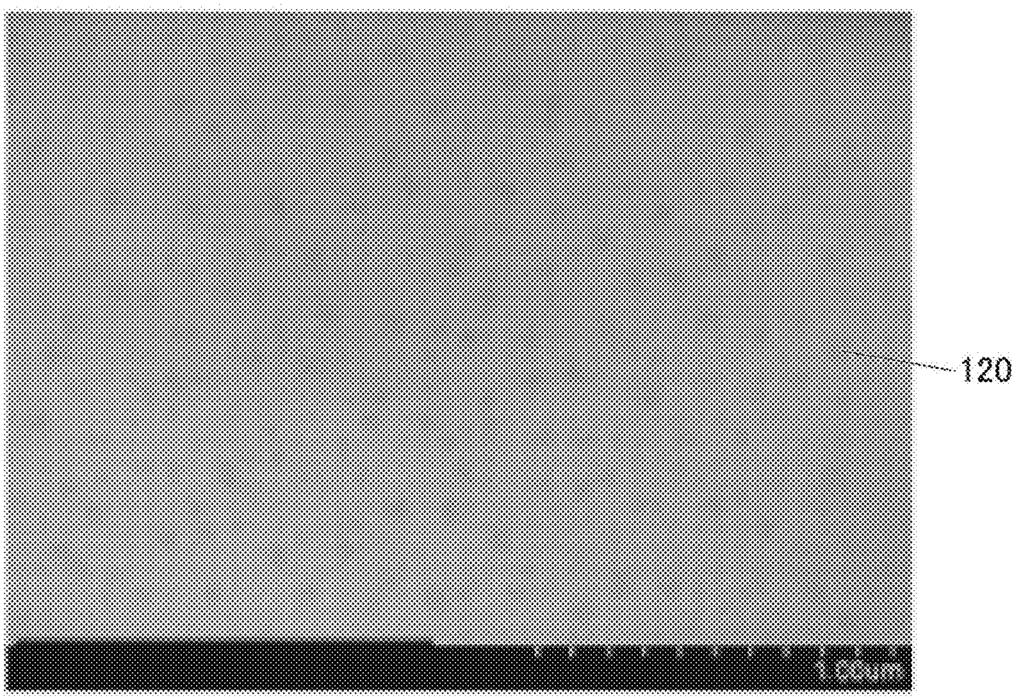
FIG. 4 is a SEM image of an intermediate metal layer of the present invention.

Colors of light to be emitted by organic EL elements of the present invention and compounds according to the present invention are determined by plotting results of measurement carried out with a spectroradiometer CS-1000 (manufactured by Konica Minolta Sensing Inc.) in the CIE chromaticity coordinates as shown in FIGS. 4 and 16 on page 108 of "Shinpen Shikisai Kagaku Handbook (Color Science Handbook, New Edition)" (edited by The Color Science Association of Japan, published by University of Tokyo Press, 1985).

In the present invention, light having a color that exhibits a deviation Duv of −20 to +20 from the black-body radiation locus at a correlated color temperature of 2500 to 7500 K is referred to as white light. The definition of Duv (=1000 duv) is set forth in JIS Z 8725:1999 "Method for Determining Distribution Temperature and Color Temperature or Correlated Color Temperature of Light Sources".

The thickness of each light emission layer included in each light emitting units in the present invention is not particularly limited, but is preferably adjusted to 5 to 200 nm, and is more preferably adjusted to 10 to 100 nm, so as to achieve uniformity among the films to be formed, prevent unnecessary high voltage application at a time of light emission, and achieve stability in color of light with respect to the drive current.

<<Intermediate Metal Layer>>

An intermediate metal layer according to the present invention is formed and placed between two light emitting units.

An intermediate metal layer may be in a state where any metal material is not provided in some minute regions, or may have so-called pinholes. An intermediate metal layer may be formed in a net-like fashion in the in-plane direction. Alternatively, intermediate metal layer forming portions may be formed like islands (in a patch-like fashion).

As an intermediate metal layer of the present invention, a metal having a work function of 3.0 eV or lower is used.

Examples of materials that can be used as an intermediate metal layer include calcium (work function: 2.87 eV, melting point: 1112.2 K), lithium (2.9 eV, 453.7 K), sodium (2.75 eV, 371K), potassium (2.3 eV, 336.9K), cesium (2.14 eV, 301.6

K), rubidium (2.16 eV, 312.1 K), barium (2.7 eV, 998.2 K), and strontium (2.59 eV, 1042.2 K). Of these materials, lithium, calcium, barium, and strontium are particularly preferable, having melting points of 400 K or higher at ordinary pressures and having low possibilities of degrading performance of the organic EL element in a high-temperature environment.

If the work function is greater than 3.0 eV, the barrier against electron injection from a light emitting unit located on the cathode side of an intermediate metal layer to a light emitting unit located on the anode side of the intermediate metal layer is large, and the drive voltage of the organic EL element is undesirably high. This becomes a more serious problem particularly in a case where the layer adjacent to the cathode side of the intermediate metal layer is not subjected to so-called n-type doping, and is formed as a single organic compound layer with a simpler structure in terms of production.

The thickness of an intermediate metal layer of the present invention is 0.6 to 5 nm. The thickness is preferably 0.8 to 3 nm, and more preferably 0.8 to 2 nm.

In a case where the thickness of an intermediate metal layer is greater than 5 nm, the efficiency of the organic EL element becomes lower due to light absorption by a metal material used therein, and preservation stability and drive stability are degraded. The reasons for the degradation in stability are not clear, but possible reasons include accelerated occurrences of current concentration at thin-film portions formed by uneven thickness of an organic layer due to thickness variation in the plane of the substrate, and short-circuit faults and the like accompanying the current concentration. The thickness variation is caused by an increase in conductivity of the film in the in-plane direction of the film, since the electrical properties of an intermediate metal layer having a great thickness is similar to the properties of bulk metal.

According to a study made by the inventors, however, in a case where the thickness of an intermediate conductive layer is smaller than 0.6 nm, performance stability of the organic EL element is degraded, and more particularly, performance variation in a relatively early stage after the production of the element is large. The reasons for the degradation in stability in an early stage are not clear, but possible reasons may be as follows. In a case where an intermediate metal layer is extremely thin and is formed with a metal film having a thickness of several angstroms or a metallic ingot having a cluster diameter, the physical and chemical stability greatly differs from that of bulk metal, and the state of the metal film or the metallic ingot changes due to a chemical reaction such as an oxidation□reduction reaction with an adjacent layer material or an interaction with charges caused by heat or driving of the element. Further, there is a higher possibility that some of the metal atoms or ions diffuse into adjacent layers. A change in performance is supposedly caused by transition from the post-film formation state to a certain metastable state.

The "thickness of an intermediate metal layer" in the present invention is defined as the "mean thickness" determined by dividing the weight of the intermediate metal layer per unit area after the film formation by the density of the material. Therefore, the thickness of some portion of the intermediate metal layer may be greater or smaller than the "mean thickness".

"Patent Literature 6" discloses a structure that uses a "single-layer internal electrode made of a material selected from the group consisting of metals having work functions of 4.5 eV or lower, and alloys and oxides thereof". However, all the structures specifically described as examples are structures using internal electrodes made of Al (work function: 4.28 eV) having a thickness of 6 nm, and the drive voltages of those structures are much higher than the drive voltages in the present invention using metals with work functions of 3.0 eV or lower as described later in Examples. Particularly, in cases where a layer adjacent to the anode side of an intermediate metal layer is formed with a single organic compound, the difference is conspicuous. Also, the thickness of 6 nm provides much lower preservation stability and drive stability than those of an element of the present invention in which the thickness is 0.6 to 5 nm, and therefore, the advantageous effects of the present invention are not predictable from "Patent Literature 6".

Meanwhile, "Patent Literature 7" discloses a structure that uses a 0.3-nm thick Li layer as a metal layer. However, as described above and will be described later in Examples, in a case where the thickness of an intermediate metal layer is as thin as 0.3 nm, performance variation is large in an early stage of driving the organic EL element or a relatively short period of time after the formation of the element.

In the present invention, so as to reduce conductivity in the in-plane direction without degrading conductivity in the voltage application direction of an intermediate metal layer, not both surfaces of the intermediate metal layer facing light emitting units are completely flat, but at least one of the surfaces is preferably formed as a non-flat surface. An intermediate metal layer having a non-flat surface has a net-like form or an island-like form in the in-plane direction of the intermediate metal layer.

In the present invention, a layer adjacent to the anode side of an intermediate metal layer is preferably a layer formed through formation of a film of a single organic compound. This is preferable not only because the production process is simplified, process control becomes easier, and the risk of performance variation due to the use of more than one material can be avoided, but also because higher long-term or high-temperature preservation stability and long-term drive stability can be achieved.

Between a light emitting unit located on the cathode side and a light emitting unit located on the anode side, a layer adjacent to an intermediate metal layer preferably has a function to easily receive charges from the respective light emitting units and inject charges into the respective light emitting units via the intermediate metal layer.

A known layer having such a function is a mixed layer doped with a charge transport organic material, and an inorganic material or an organic metal complex or the like that can oxidize or reduce the organic material or can form a charge transfer complex with the organic material, for example, so as to increase charge transportability.

Alternatively, it is known that a thin layer of an alkali compound or an alkaline earth compound containing alkali atoms or alkaline earth atoms with low work functions is used. For example, in "Patent Literature 6", a layer made of LiF is provided as a layer adjacent to the anode side of an Al internal electrode. It has been found that a method involving a thin layer of such a doping material (an alkali or alkaline earth compound) not only has disadvantages in the production process but also degrades preservation stability and drive stability. This is probably because a doping material, more specifically, alkali atoms, alkali ions, alkaline earth atoms or ions, or chemical species containing them, diffuses in the organic EL element due to heat and/or activation, and causes performance variation in another organic function layer in the element. In a case where a layer containing an alkali or alkaline earth compound is formed adjacent to an intermediate metal layer, a chemical reaction might be caused between the compounds forming these layers over short-term or long-term preservation, and might result in performance variation. The inventors have found that such performance degradation can be reduced by employing a structure of the present invention.

<<Light Emission Layer>>

The following is a description of host compounds and dopant compounds that can be contained in light emission layers.

(1) Phosphorescent Host Compounds

Phosphorescent host compounds that can be used in the present invention are not particularly limited in terms of structure, and typical examples include those having a basic skeleton such as a carbazole derivative, a triarylamine derivative, an aromatic borane derivative, a nitrogen-containing heterocyclic compound, a thiophene derivative, a furan derivative, and an oligoarylene compound, and derivatives such as a carboline derivative and a diazacarbazole derivative (here, the diazacarbazole derivative has a ring structure in which at least one of the carbon atoms of the hydrocarbon ring forming the carboline ring of the carboline derivative is substituted with a nitrogen atom).

It is possible to use one of those phosphorescent host compounds or a combination of some of those phosphorescent host compounds.

A phosphorescent host compound used in a phosphorescence emission layer according to the present invention is preferably a compound represented by the general formula (a) shown below.

[Formula 1]

General formula (a)

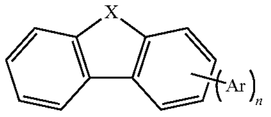

In the general formula (a), "X" represents NR', O, S, CR'R" or SiR'R", and R' and R" each represent a hydrogen atom or a substituent. "Ar" represents an aromatic ring. Further, n represents an integer of 0 to 8.

Examples of substituents that can be represented by R' and R" in "X" in the general formula (a) include alkyl groups (such as a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group), cycloalkyl groups (such as a cyclopentyl group and a cyclohexyl group), alkenyl groups (such as a vinyl group, an allyl group, a 1-propenyl group, a 2-butenyl group, a 1,3-butadienyl group, a 2-pentenyl group, and an isopropenyl group), alkynyl groups (such as an ethynyl group and a propargyl group), aromatic hydrocarbon groups (also called aromatic carbon ring groups or aryl groups, such as a phenyl group, a p-chlorophenyl group, a mesityl group, a tolyl group, a xylyl group, a naphthyl group, an anthryl group, an azulenyl group, an acenaphthenyl group, fluorenyl group, a phenanthryl group, an indenyl group, a pyrenyl group, and a biphenyryl group), aromatic heterocyclic groups (such as a furyl group, a thienyl group, a pyridyl group, a pyridazinyl group, a pyrimidinyl group, a piradinyl group, a triazinyl group, an imidazolyl group, a pyrazolyl group, a triazolyl group, a quinazolinyl group, a carbazolyl group, a carbolynyl group, a diazacarbazoyl group (in which one of the carbon atoms forming the carboline ring of the carbolinyl group is substituted with a nitrogen atom), and a phthalazinyl group), heterocyclic groups (such as a pyrrolidyl group, an imidazolidyl group, a morpholyl group, and an oxazolidyl group), alkoxy groups (such as a methoxy group, an ethoxy group, a propyloxy group, a pentyloxy group, a hexyloxy group, an octyloxy group, and a dodecyloxy group), cycloalkoxy groups (such as a cyclopentyloxy group and a cyclohexyloxy group), aryloxy groups (such as a phenoxy group and a naphthyloxy group), alkylthio groups (such as a methylthio group, an ethylthio group, a propylthio group, a pentylthio group, a hexylthio group, an octylthio group, and a dodecylthio group), cycloalkylthio groups (such as a cyclopentylthio group and a cyclohexylthio group), arylthio groups (such as a phenylthio group and a naphthylthio group), alkoxycarbonyl groups (such as a methyloxycarbonyl group, an ethyloxycarbonyl group, a butyloxycarbonyl group, an octyloxycarbonyl group, and a dodecyloxycarbonyl group), aryloxycarbonyl groups (such as a phenyloxycarbonyl group and a naphthyloxycarbonyl group), sulfamoyl groups (such as an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), acyl groups (such as an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group), acyloxy groups (such as an acetyloxy group, an ethylcarbonyloxy group, a butylcarbonyloxy group, an octylcarbonyloxy group, a dodecylcarbonyloxy group, and a phenylcarbonyloxy group), amido groups (such as a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), carbamoyl groups (such as an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), ureido groups (such as a methylureido group, an ethylureido group, a pentylureido group, a cyclohexylureido group, an octylureido group, a dodecylureido group, a phenylureido group, a naphthylureido group, and a 2-pyridylaminoureido group), sulfinyl groups (such as a methylsulfinyl group, an ethylsulfinyl group, a butylsulfinyl group, a cyclohexylsulfinyl group, a 2-ethylhexylsulfinyl group, a docecylsulfinyl group, a phenylsulfinyl group, a naphthylsulfinyl group, and a 2-pyridylsulfinyl group), alkylsulfonyl groups (such as a methylsulfonyl group, an ethylsulfonyl group, a butylsulfinyl group, a cyclohexylsulfonyl group, a 2-ethylhexylsulfonyl group, and a dodecylsulfonyl group), arylsulfonyl groups or heteroarylsulfonyl groups (such as a phenylsulfonyl group, a naphthylsulfonyl group, and a 2-pyridylsulfonyl group), amino groups (such as an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), halogen atoms (such as a fluorine atom, a chlorine atom, and a bromine atom), fluorinated hydrocarbon groups (such as a fluoromethyl group, a trifluoromethyl group, a pentafluoroethyl group, and a pentafluorophenyl group), a cyano group, a nitro group, a hydroxyl group, a mercapto group, silyl groups (such as a trimethylsilyl group, a triisopropylsilyl group, a triphenylsilyl group, and a phenyldiethylsilyl group), and a phosphono group.

These substituents may be further substituted with the above substituents. Also, some of these substituents may be bound together to form a ring.

In the general formula (a), preferred "X" is NR' or O, and an aromatic hydrocarbon group and an aromatic heterocyclic group are particularly preferable as R'.

In the general formula (a), the aromatic ring represented by "Ar" is an aromatic hydrocarbon ring or a heteroaromatic ring. The aromatic ring may be a monocycle or a condensed ring, and may have one of substituents described later even if unsubstituted.

Examples of aromatic hydrocarbon rings that can be represented by "Ar" in the general formula (a) include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoroanthrene ring, a penthacene ring, a perylene ring, a pentaphene ring, a picene ring, a pyranthrene ring, and an anthraanthrene ring. These rings may further have a substituent.

Examples of heteroaromatic rings that can be represented by "Ar" in the general formula (a) include a furan ring, a dibenzofuran ring, a thiophen ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, an indazole ring, a benzothiazole ring, a benzoxazole ring, a quinoxaline ring, a quinazoline ring, a cinnoline ring, a quinoline ring, an isoquinoline ring, a phthalazine ring, a naphthyridine ring, a carbazole ring, a carboline ring, and a diazacarbazole ring (a ring in which one of the carbon atoms of the hydrocarbon ring forming the carboline ring is further substituted with a nitrogen atom). These rings may further have a substituent.

Of the above rings, preferable examples of aromatic rings that can be represented by "Ar" in the general formula (a) are a carbazole ring, a carboline ring, a dibenzofuran ring, and a benzene ring, and more preferable examples are a carbazole ring, a carboline ring, and a benzene ring. Of the above rings, a benzene ring having a substituent is preferable, and a benzene ring having a carbazolyl group is particularly preferable.

A preferable aromatic ring represented by "Ar" in the general formula (a) is a three- or more-membered condensed ring as described below. Specific examples of three- or more-membered condensed aromatic hydrocarbon rings include a naphthacene ring, an anthracene ring, a tetracene ring, a pentacene ring, a hexacene ring, a phenanthrene ring, a pyrene ring, a benzopyrene ring, a benzoazurene ring, a chrycene ring, a benzochrycene ring, an acenaphthene ring, an acenaphthylene ring, a triphenylene ring, a coronene ring, a benzocoronene ring, a hexabenzocoronene ring, a fluorene ring, a benzofluorene ring, a fluoranthene ring, a perylene ring, a naphthoperylene ring, a pentabenzoperylene ring, a benzoperylene ring, a pentaphene ring, a picene ring, a pyranthrene ring, a coronene ring, a naphthocoronene ring, an ovalene ring, and an anthraanthrene ring. These rings may further have a substituent.

Specific examples of three- or more-membered condensed heteroaromatic rings include an acridine ring, a benzoquinoline ring, a carbazole ring, a carboline ring, a phenazine ring, a phenanthridine ring, a phenanthroline ring, a carboline ring, a cyclazine ring, a quindoline ring, a thepenidine ring, a quinindoline ring, a triphenodithiazine ring, a triphenodioxazine ring, a phenanthrazine ring, an anthrazine ring, a perimidine ring, a diazacarbazole ring (in which one of the carbon atoms constituting the carboline ring is substituted with a nitrogen atom), a phenanthroline ring, a dibenzofuran ring, a dibenzothiophene ring, a naphthofuran ring, a naphthothiophene ring, a benzodifuran ring, a benzodithiophene ring, a naphthodifuran ring, a naphthodithiophene ring, an anthrafuran ring, an anthradifuran ring, an anthrathiophene ring, an anthradithiophene ring, a thianthrene ring, a phenoxathiin ring, a thiophanthrene ring (a naphthothiophene ring). These rings may further have a substituent.

In the general formula (a), a substituent that may be included in an aromatic ring represented by "Ar" is equivalent to a substituent represented by R' or R".

Also, in the general formula (a), n represents an integer of 0 to 8, or preferably an integer of 0 to 2. Particularly, in a case where "X" is O or S, the integer is preferably 1 or 2.

Specific examples of phosphorescent host compounds that can be represented by the general formula (a) are shown below, but the present invention is not limited to them.

[Formula 2]

1-1

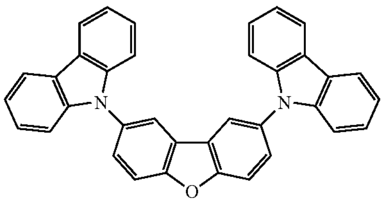

1-2

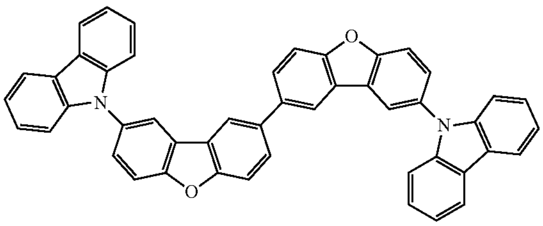

1-3

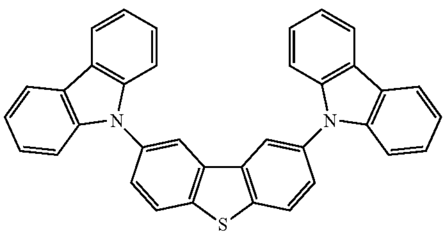

1-4

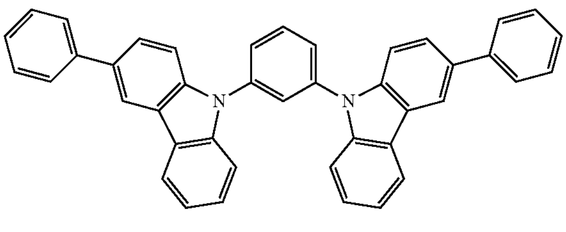

-continued
1-5
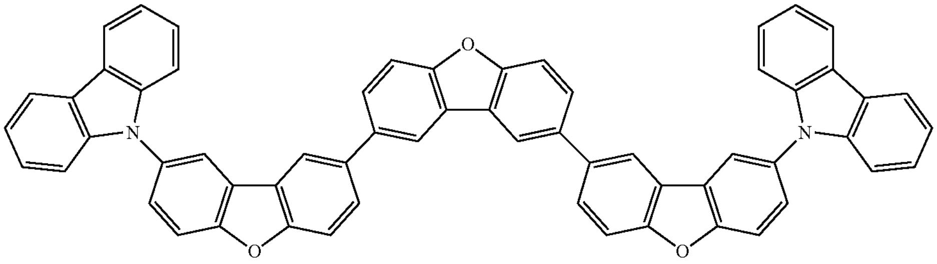
1-6
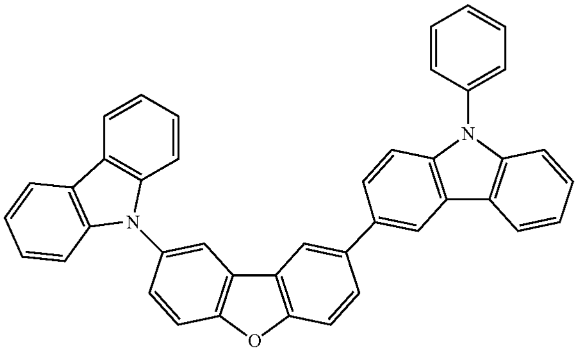
[Formula 3]
1-7
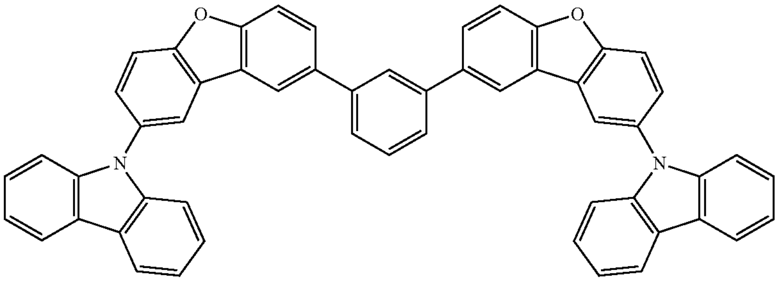
1-8
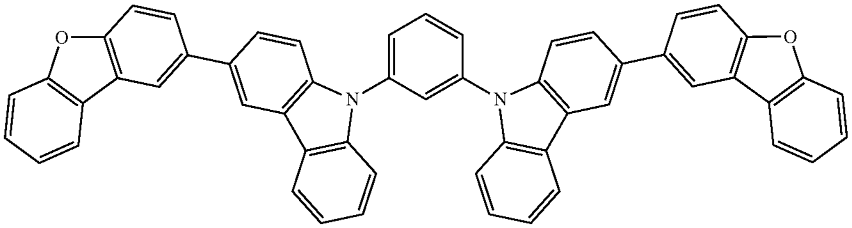
1-9
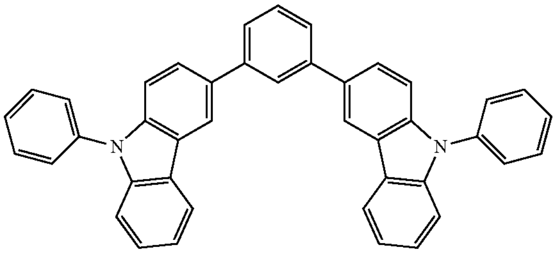
1-10
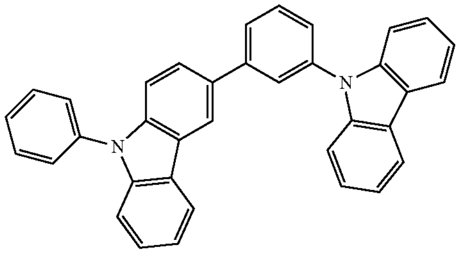

-continued
1-11
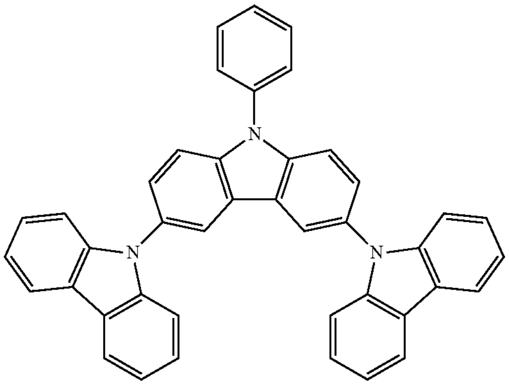
1-12
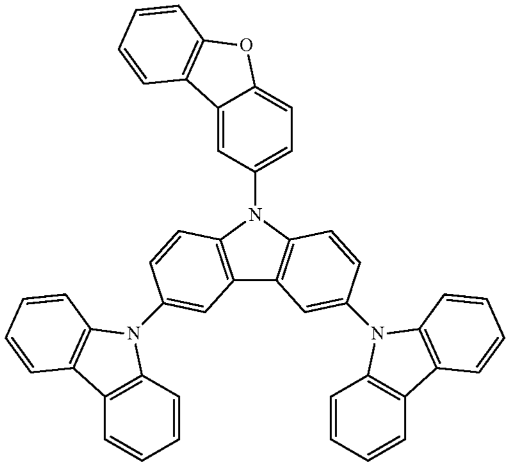
[Formula 4]
1-13
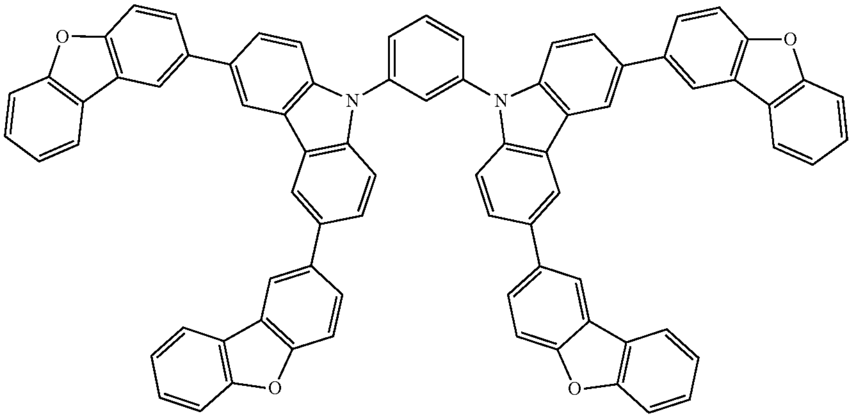
1-14
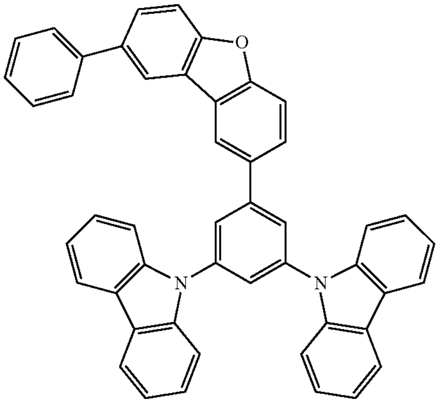
1-15
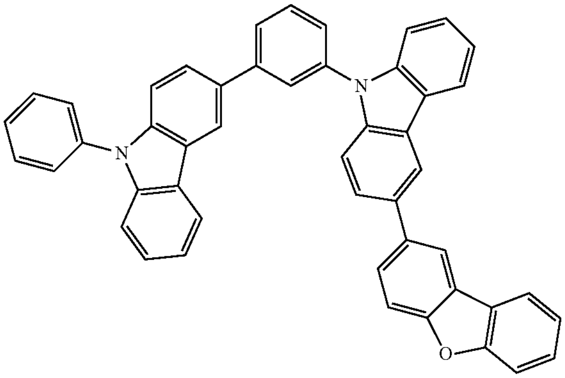

-continued
1-16
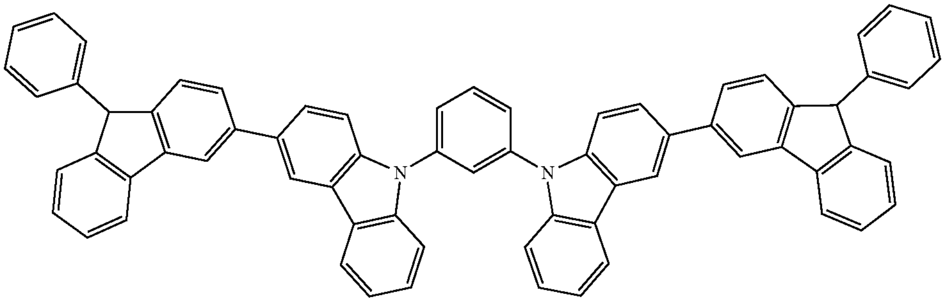
1-17
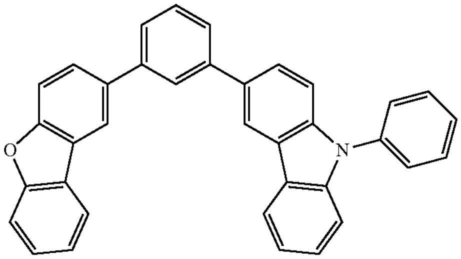
1-18
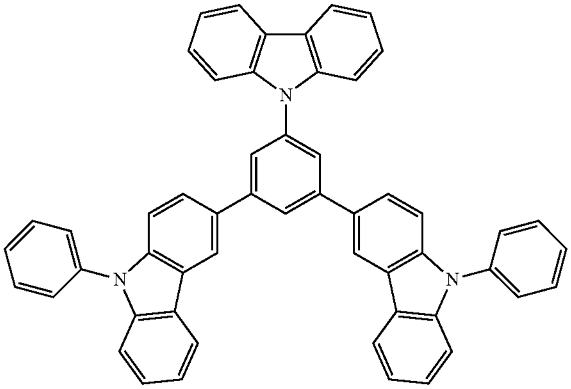
[Formula 5]
1-19
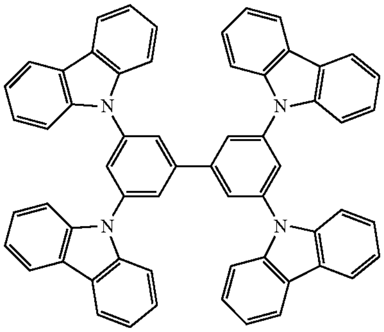
1-20
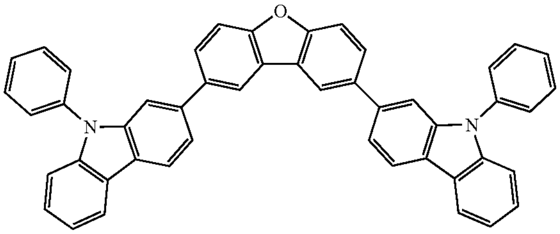
1-21
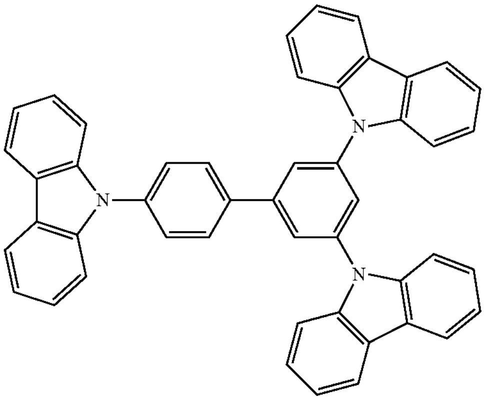
1-22
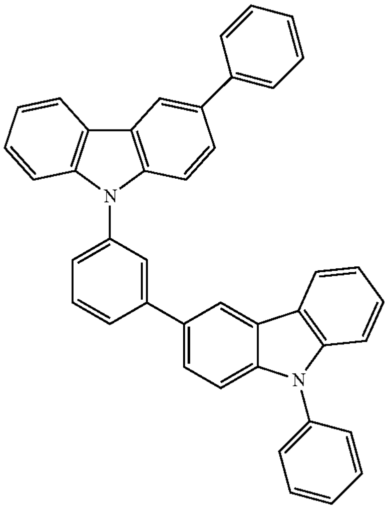

-continued
1-23
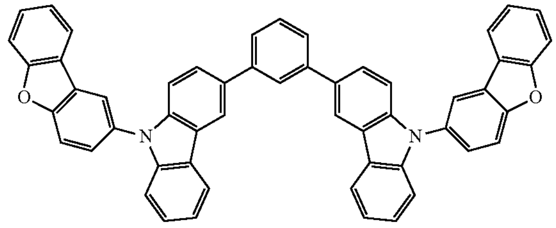
1-24
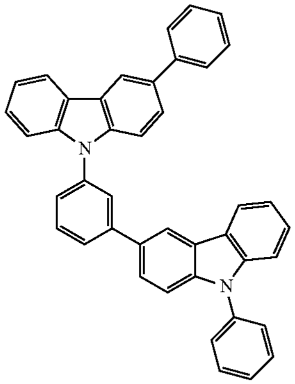
[Formula 6]
1-25
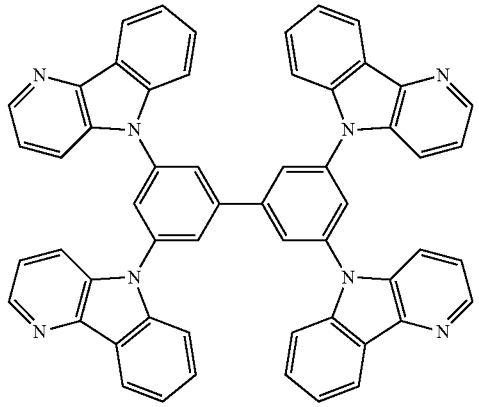
1-26
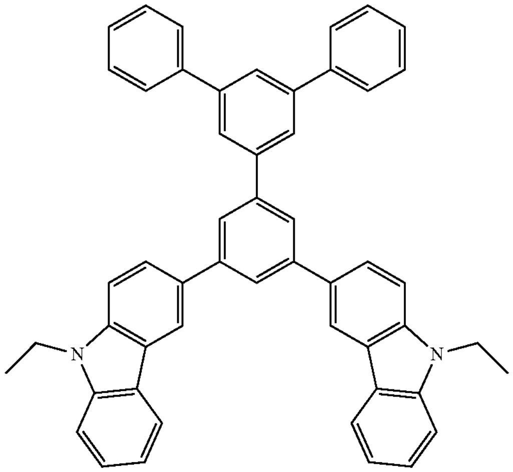
1-27
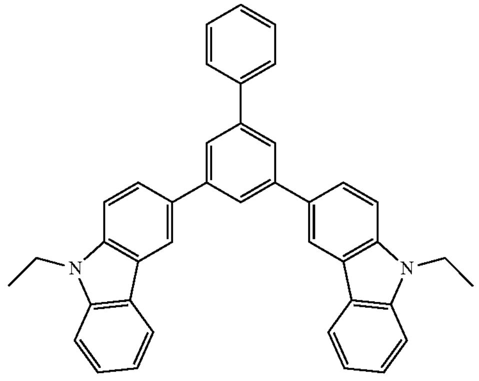
1-28
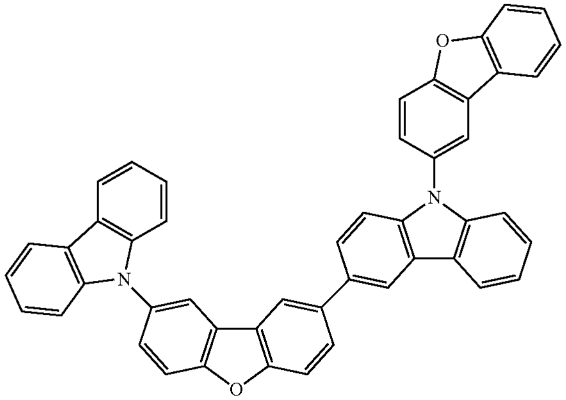

-continued
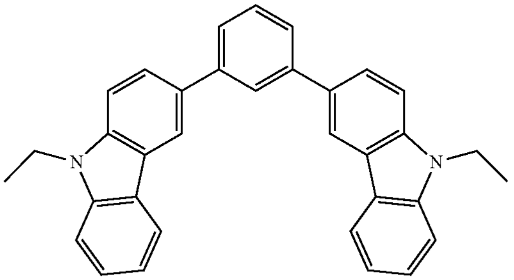
1-29
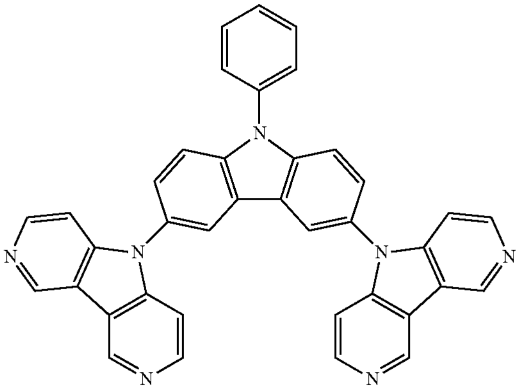
1-30
[Formula 7]
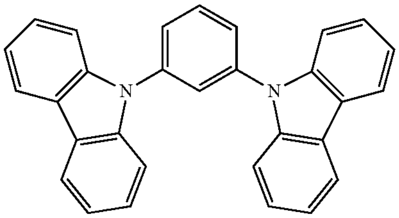
1-31
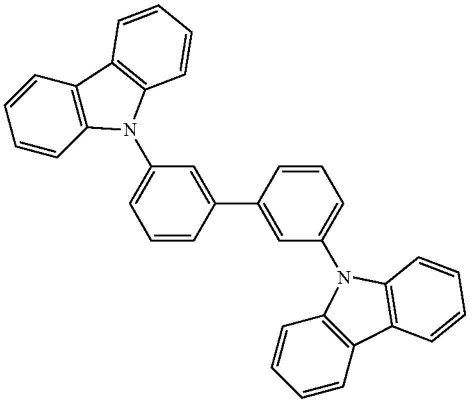
1-32
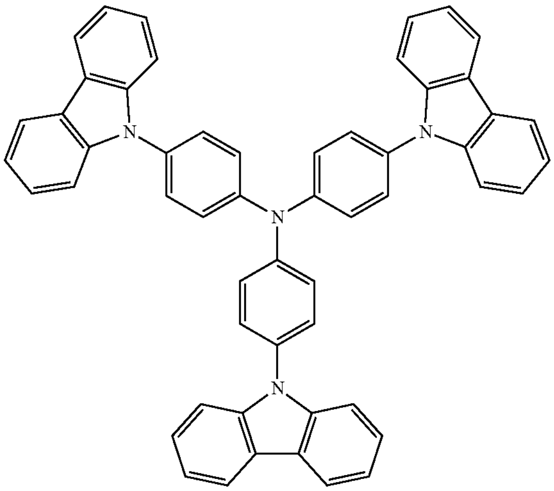
1-33
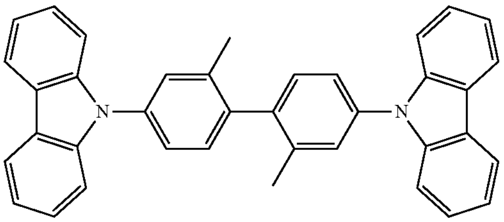
1-34
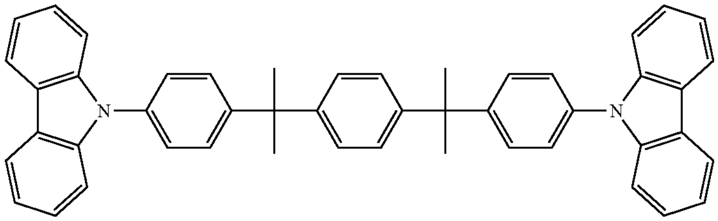
1-35

-continued
[Formula 8]
1-36
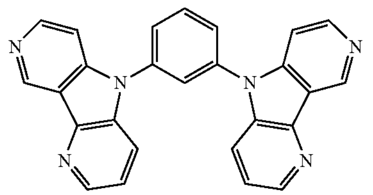
1-37
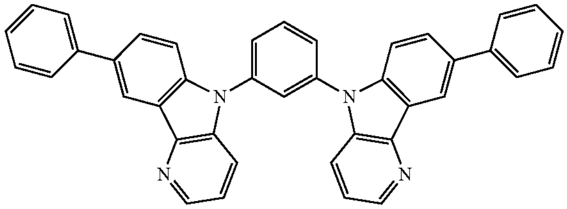
1-38
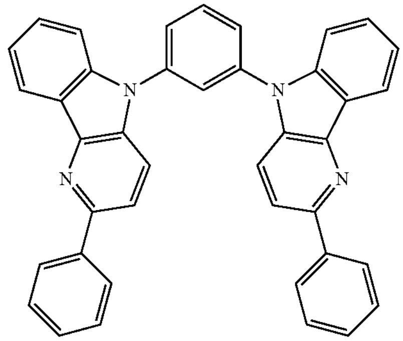
1-39
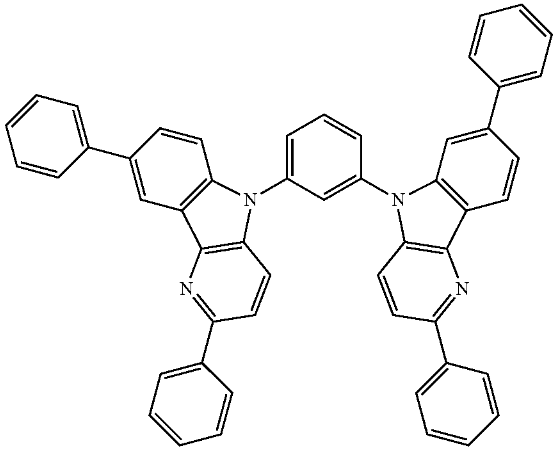
1-40
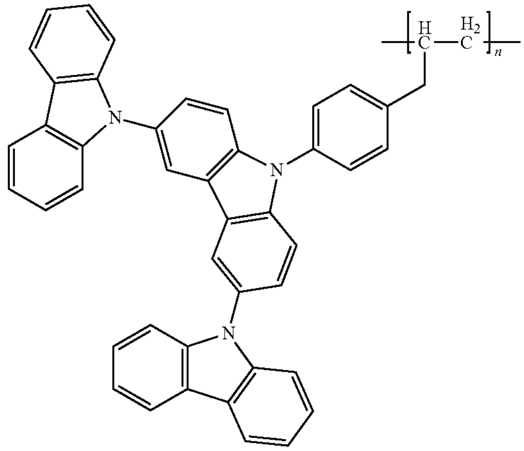

-continued

[Formula 9]

1-41

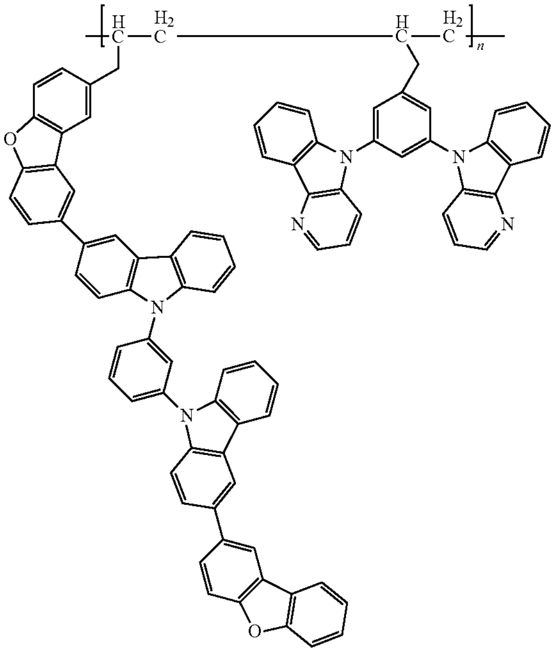

1-42

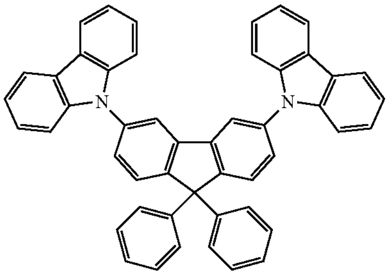

1-43

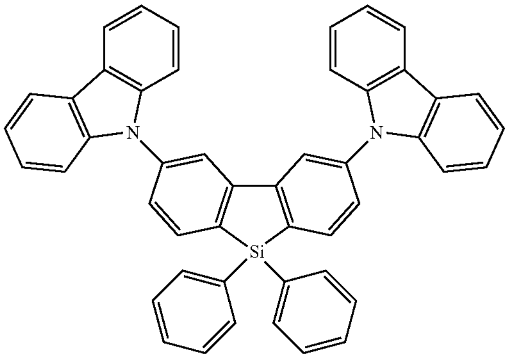

A phosphorescent host compound used in the present invention may be a low molecular compound, a high molecular compound having repeating units, or a low molecular compound having a polymerizable group such as a vinyl group or an epoxy group (a deposition-polymerizable light-emitting host).

A phosphorescent host compound is preferably a compound that has hole transport properties and electron transport properties, prevents increase in wavelength of emitted light, and has a high Tg (glass transition temperature). In the present invention, a compound having a glass transition point of 90° C. or higher is preferable, and a compound having a glass transition point of 130° C. or higher is more preferable, being able to achieve excellent characteristics.

Here, a glass transition point (Tg) is a value obtained by a method compliant with JIS K 7121, with the use of DSC (Differential Scanning Colorimetry).

Specific examples of conventionally-known preferred host compounds are disclosed in the following literatures: JP 2001-257076 A, JP 2002-308855 A, JP 2001-313179 A, JP 2002-319491 A, JP 2001-357977 A, JP 2002-334786 A, JP 2002-8860 A, JP 2002-334787 A, JP 2002-15871 A, JP 2002-334788 A, JP 2002-43056 A, JP 2002-334789 A, JP 2002-75645 A, JP 2002-338579 A, JP 2002-105445 A, JP 2002-343568 A, JP 2002-141173 A, JP 2002-352957 A, JP 2002-203683 A, JP 2002-363227 A, JP 2002-231453 A, JP 2003-3165 A, JP 2002-234888 A, JP 2003-27048 A, JP 2002-255934 A, JP 2002-260861 A, JP 2002-280183 A, JP 2002-299060 A, JP 2002-302516 A, JP 2002-305083 A, JP 2002-305084 A, and JP 2002-308837 A, for example.

In the present invention, when more than one phosphorescence emission layers is provided, light emission layers may contain different phosphorescent host compounds from one another, but preferably contain the same compound so as to improve production efficiency and process control.

A phosphorescent host compound preferably has a minimum excited triplet energy (T1) that is higher than 2.7 eV, so as to achieve high luminous efficiency.

A minimum excited triplet energy in the present invention refers to the highest energy of the emission band corresponding to the minimum vibration-band transition of a phosphorescence emission spectrum observed at liquid nitrogen temperature after a host compound is dissolved in a solvent.

(2) Phosphorescence Emission Dopants

Phosphorescence emission dopants that can be used in the present invention can be selected from known phosphorescence emission dopants. For example, phosphorescence emission dopants can be selected from among complex compounds containing metals of Groups 8 to 10 in the periodic table of elements, or more preferably, are selected from among iridium compounds, osmium compounds, platinum compounds (platinum complex compounds), or rare earth complexes. Of the above materials, the most preferable ones are iridium compounds.

In a case where an organic EL element that emits white light according to the present invention is manufactured, the luminous body to emit light at least in the green, yellow, and red regions is preferably a phosphorescence emission material.

(Substructures Represented by General Formulas (A) to (C))

In a case where a blue phosphorescence emission dopant is used in the present invention, the blue phosphorescence emission dopant can be appropriately selected from among known ones used in light emission layers of organic EL elements, but the blue phosphorescence emission dopant preferably has at least one of the substructures represented by the general formulas (A) to (C) shown below.

[Formula 10]

General formula (A)

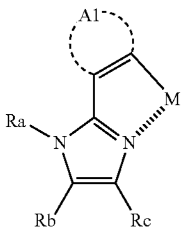

In the general formula (A), "Ra" represents a hydrogen atom, an aliphatic group, an aromatic group, or a heterocyclic group, "Rb" and "Rc" each represent a hydrogen atom or a substituent, "A1" represents the residue necessary for forming an aromatic ring or a heteroaromatic ring, and "M" represents Ir or Pt.

[Formula 11]

General formula (B)

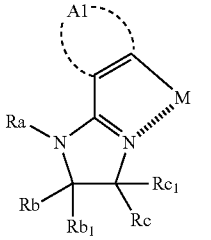

In the general formula (B), "Ra" represents a hydrogen atom, an aliphatic group, an aromatic group, or a heterocyclic group, "Rb", "Rc", "$Rb_1$", and "$Rc_1$" each represent a hydrogen atom or a substituent, "A1" represents the residue necessary for forming an aromatic ring or a heteroaromatic ring, and "M" represents Ir or Pt.

[Formula 12]

General formula (C)

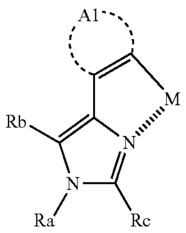

In the general formula (C), "Ra" represents a hydrogen atom, an aliphatic group, an aromatic group, or a heterocyclic group, "Rb" and "Rc" each represent a hydrogen atom or a substituent, "A1" represents the residue necessary for forming an aromatic ring or a heteroaromatic ring, and "M" represents Ir or Pt.

Examples of aliphatic groups that can be represented by "Ra" in the general formulas (A) to (C) include alkyl groups (such as a methyl group, an ethyl group, a propyl group, a butyl group, a pentyl group, an isopentyl group, a 2-ethylhexyl group, an octyl group, an undecyl group, a dodecyl group, and a tetradecyl group), and cycloalkyl groups (such as a cyclopentyl group and a cyclohexyl group). Examples of aromatic groups include a phenyl group, a tolyl group, an azulenyl group, an anthranyl group, a phenanthryl group, a pyrenyl group, a chrysenyl group, a naphthacenyl group, an o-terphenyl group, a m-terphenyl group, a p-terphenyl group, an acenaphthenyl group, a coronenyl group, a fluorenyl group, and a perylenyl group. Examples of heterocyclic groups include a pyrrolyl group, an indolyl group, a furyl group, a thienyl group, an imidazolyl group, a pyrazolyl group, an indolizinyl group, a quinolinyl group, a carbazolyl group, an indolinyl group, a thiazolyl group, a pyridyl group, a pyridazinyl group, a thiadiazinyl group, an oxadiazolyl group, a benzoquinolinyl group, a thiadiazolyl group, a pyrrolothiazolyl group, a pyrrolopyridazinyl group, a tetrazolyl group, an oxazolyl group, and a chromanyl group. Each of these groups may have a substituent.

Examples of substituents that can be represented by "Rb", "Rc", "$Rb_1$", and "$Rc_1$" in the general formulas (A) to (C) include alkyl groups (such as a methyl group, an ethyl group, a propyl group, an isopropyl group, a tert-butyl, a pentyl group, a hexyl group, an octyl group, a dodecyl group, a tridecyl group, a tetradecyl group, and a pentadecyl group), cycloalkyl groups (such as a cyclopentyl group and a cyclohexyl group), alkenyl groups (such as a vinyl group and an allyl group), alkynyl groups (such as an ethynyl group and a propargyl group), aryl groups (such as a phenyl group and a naphthyl group), aromatic heterocyclic groups (such as a furyl group, a thienyl group, a pyridyl group, a pyridazinyl group, pyrimidinyl group, a pyrazinyl group, a triazinyl group, an imidazolyl group, a pyrazolyl group, a thiazolyl group, a quinazolinyl group, and a phthalazinyl group), heterocyclic groups (such as a pyrrolidyl group, an imidazolydyl group, a morpholyl group, and an oxazolidyl group), alkoxyl groups (such as a methoxy group, an ethoxy group, a propyloxy group, a pentyloxy group, a hexyloxy group, an octyloxy group, and a dodecyl oxygroup), cycloalkoxyl groups (such as a cyclopentyloxy group and a cyclohexyloxy group), aryloxy groups (such as a phenoxy group and a naphthyloxy group), alkylthio groups (such as a methylthio group, an ethylthio group, a propylthio group, a pentylthio group, a hexylthio group, an octylthio group, and a dodecylthio group), cycloalkylthio groups (such as a cyclopentylthio group and a cyclohexylthio group), arylthio groups (such as a phenylthio group and a naphthylthio group), alkoxycarbonyl groups (such as a methyloxycarbonyl group, an ethyloxycarbonyl group, a butyloxycarbonyl group, an octyloxycarbonyl group, and a dodecyloxycarbonyl group), aryloxycarbonyl groups (such as a phenyloxycarbonyl group and a naphthyloxycarbonyl group), sulfamoyl groups (such as an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodedylaminosulfonyl group, a phenylaminosulfonyl group, a naphthylaminosulfonyl group, and a 2-pyridylaminosulfonyl group), acyl groups (such as an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group), acyloxy groups (such as an acetyloxy group, an ethylcarbonyloxy group, a butylcarbonyloxy group, an octylcarbonyloxy group, a dodecylcarbonyloxy group, and a phenylcarbonyloxy group), amide groups (such as a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), carbamoyl groups (such as an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), ureido groups (such as a methylureido group, an ethylureido group, a pentylureido group, a cyclohexylureido group, an octylureido group, a dodecylureido group, a phenylureido group, a naphthylureido group, and a 2-pyridylaminoureido group), sulfinyl groups (such as a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group), alkylsulfonyl groups (such as a methylsulfonyl group, an ethylsulfonyl group, a butylsulfonyl group, a cyclohexylsulfonyl group, a 2-ethylhexylsulfonyl group, and a dodecylsulfonyl group), arylsulfonyl groups (such as a phenylsulfonyl group, a naphthylsulfonyl group, and a 2-pyridylsulfonyl group), amino groups (such as an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), halogen atoms (such as a fluorine atom, a chlorine atom, and a bromine atom), hydrofluorocarbon groups (such as a fluoromethyl group, a trifluoromethyl group, a pentafluoroethyl group, and a pentafluorophenyl group), a cyano group, a nitro group, a hydroxyl group, a mercapto group, and silyl groups (such as a trimethylsilyl group, a triisopropylsilyl group, a triphenylsilyl group, and a phenyldiethylsilyl group). These substituents may be further substituted with the above substituents.

Examples of aromatic rings that can be represented by “A1” in the general formulas (A) to (C) include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoroanthrene ring, a penthacene ring, a perylene ring, a pentaphene ring, a picene ring, a pyranthrene ring, and an anthraanthrene ring. Examples of heteroaromatic rings include a furan ring, a thiophene ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, a benzothiazole ring, a benzoxazole ring, a quinoxaline ring, a quinazoline ring, a phthalazine ring, a carbazole ring, a carboline ring, and a diazacarbazole ring (in which one of the carbon atoms of the hydrocarbon ring forming the carboline ring is further substituted with a nitrogen atom).

In the general formulas (A) to (C), “M” represents Ir or Pt, and Ir is particularly preferable.

The structures represented by the general formulas (A) to (C) are substructures, and a ligand corresponding to the valence of the central metal is required to complete a structure as an emission dopant. Specific examples of such ligands include halogens (such as a fluorine atom, a chlorine atom, a bromine atom, and an iodine atom), aryl groups (such as a phenyl group, a p-chlorophenyl group, a mesityl group, a tolyl group, a xylyl group, a biphenyl group, a naphthyl group, an anthryl group, and a phenanthryl group), alkyl groups (such as a methyl group, an ethyl group, an isopropyl group, and a hydroxyethyl group, a methoxymethyl group, a trifluoromethyl group, and t-butyl group), an alkyloxy group, an aryloxy group, an alkylthio group, an arylthio group, aromatic heterocyclic groups (such as a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbolinyl group, and a phthalazinyl group), and substructures represented by the respective general formulas (A) to (C) minus metals.

It is also preferable to complete a tris-form with the three substructures represented by the general formulas (A) to (C).

Examples of compounds having the substructures represented by the above general formulas (A) to (C) of blue phosphorescence emission dopants according to the present invention are shown below, but the present invention is not limited to them.

[Formula 13]

D-1

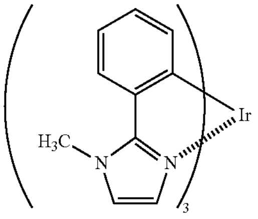

-continued
D-2
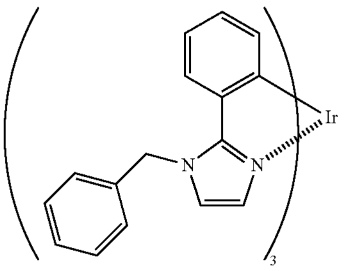
D-3
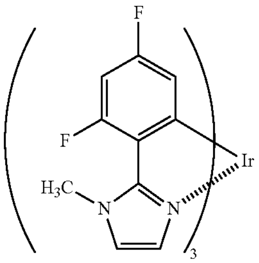
D-4
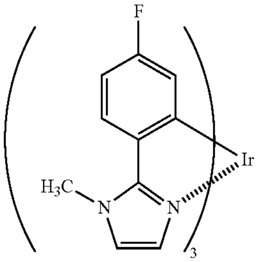
D-5
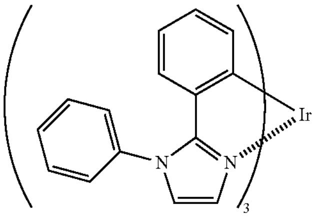
D-6
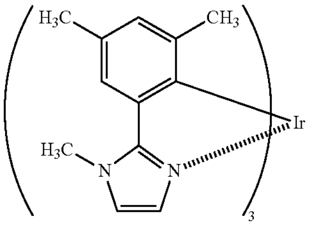
D-7
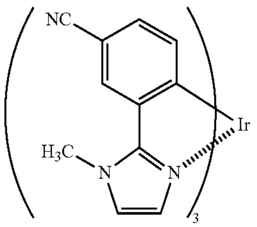
-continued
D-8
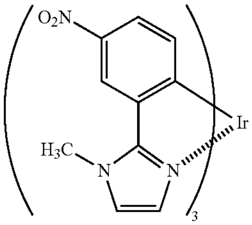
D-9
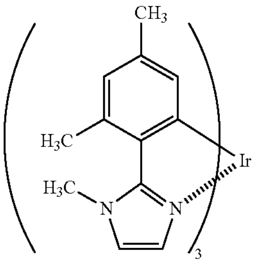
D-10
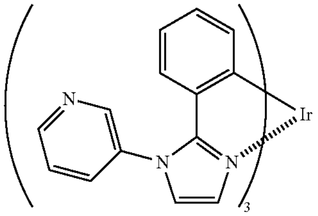
D-11
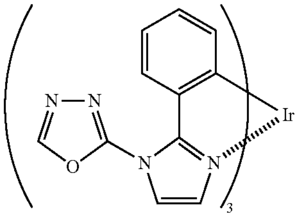
D-12
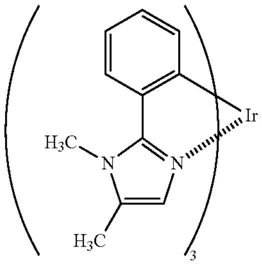
D-13
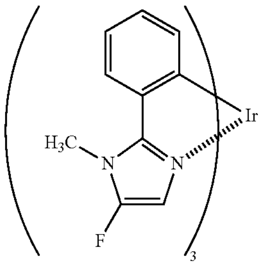

-continued
D-14
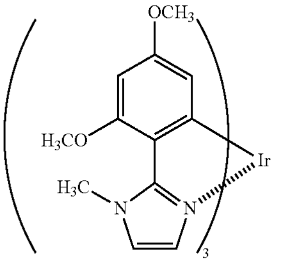
D-15
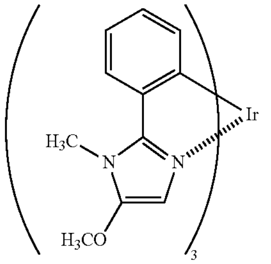
[Formula 14]
D-16
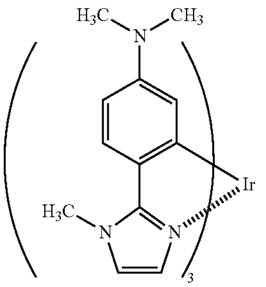
D-17
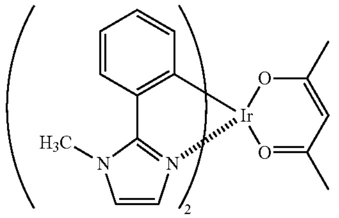
D-18
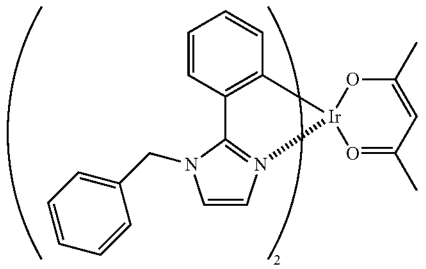
D-19
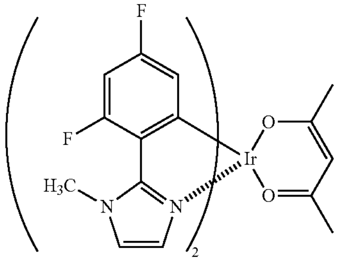
-continued
D-20
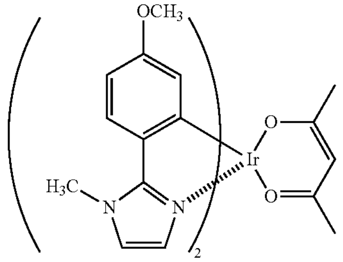
D-21
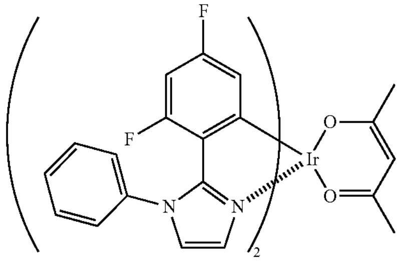
D-22
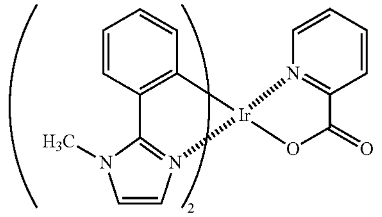
D-23
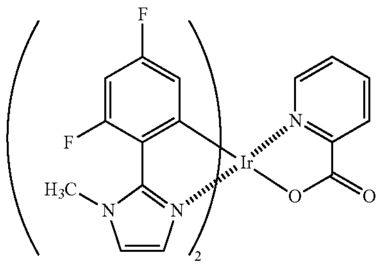
D-24
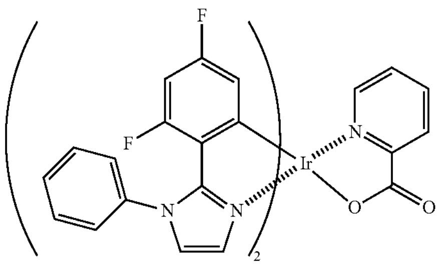
D-25
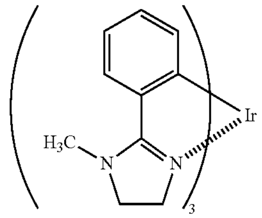

-continued
[Formula 15]
D-26
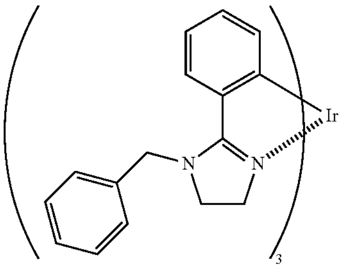
D-27
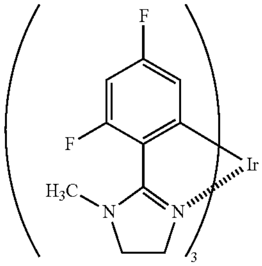
D-28
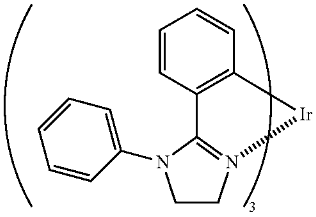
D-29
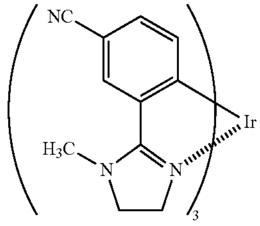
D-30
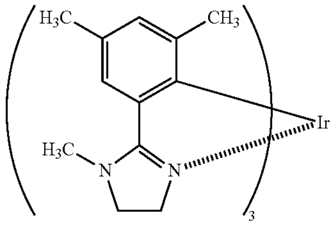
D-31
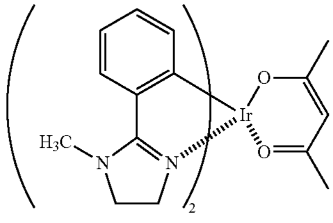
-continued
D-32
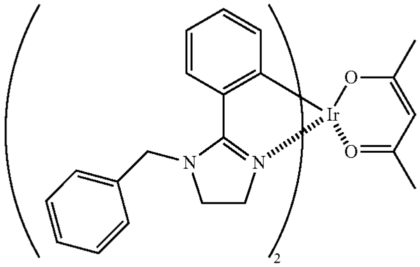
D-33
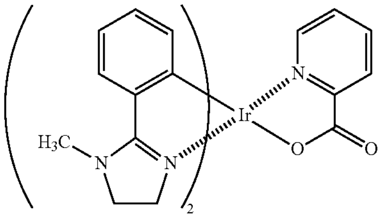
D-34
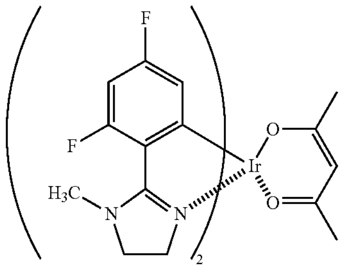
D-35
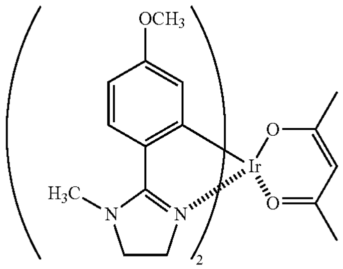
D-36
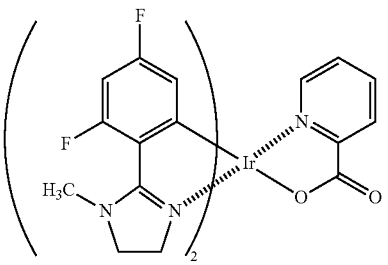
D-37
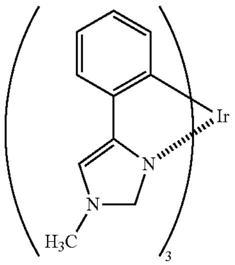

-continued
D-38
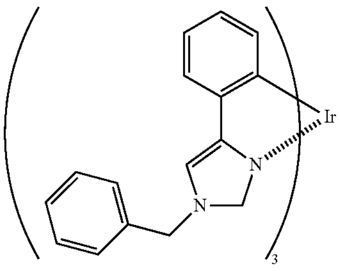
[Formula 16]
D-39
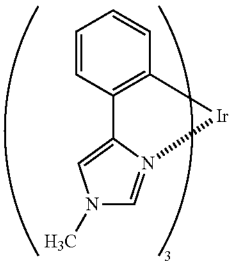
D-40
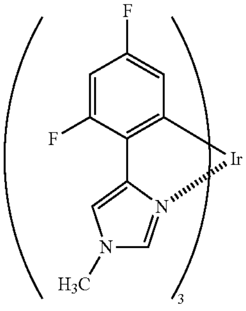
D-41
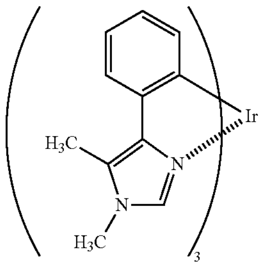
D-42
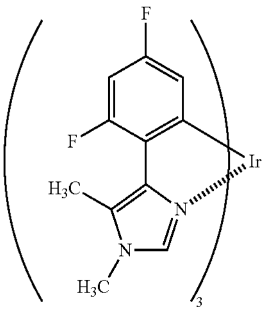
-continued
D-43
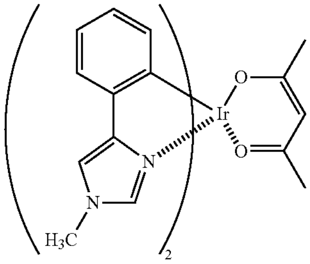
D-44
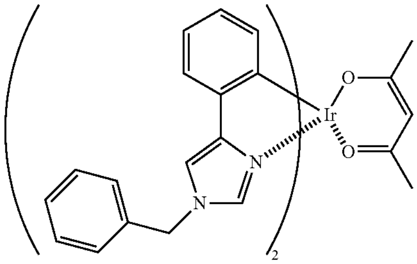
D-45
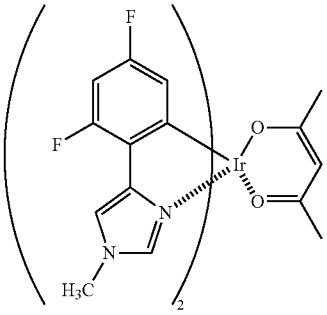
D-46
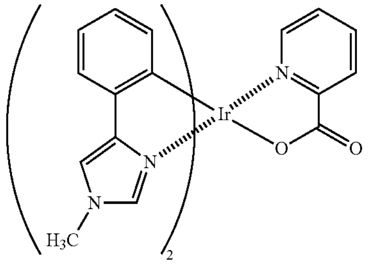
D-47
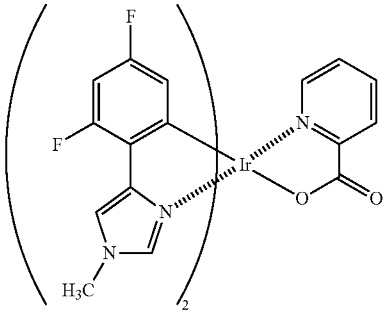

-continued
D-48
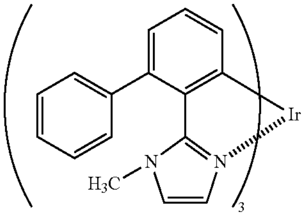
D-49
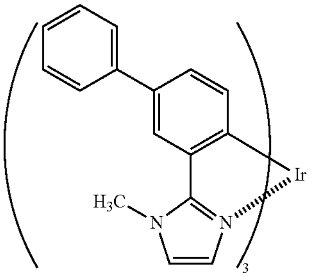
D-50
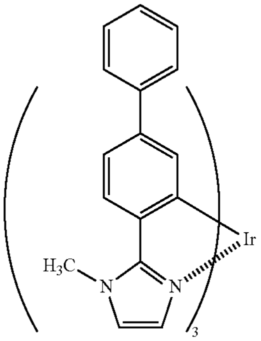
D-51
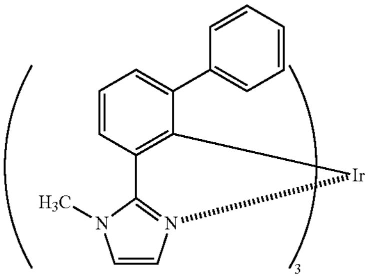
[Formula 17]
D-52
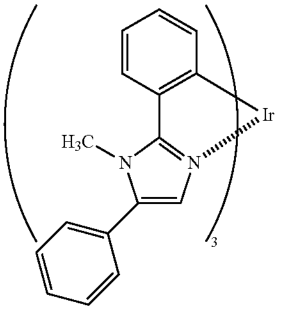
-continued
D-53
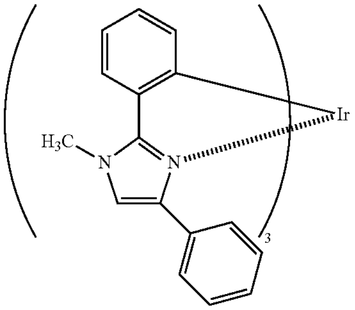
D-54
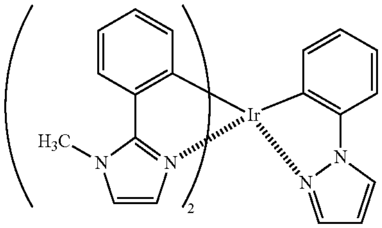
D-55
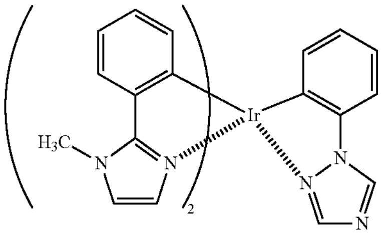
D-56
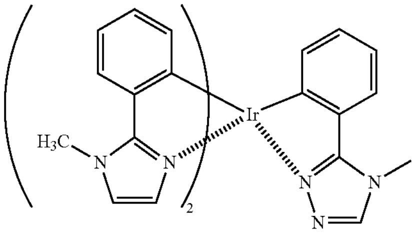
D-57
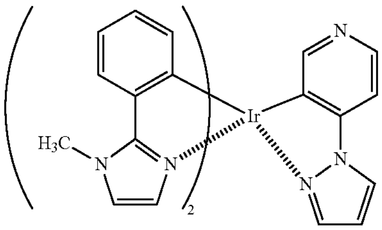
D-58
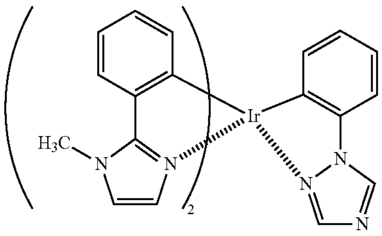

-continued
D-59
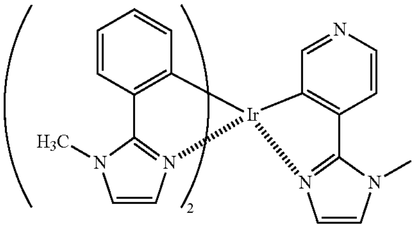
D-60
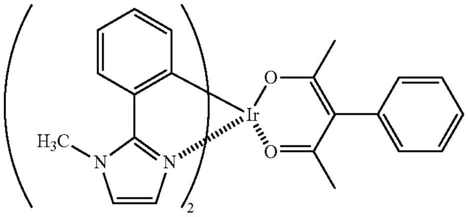
D-61
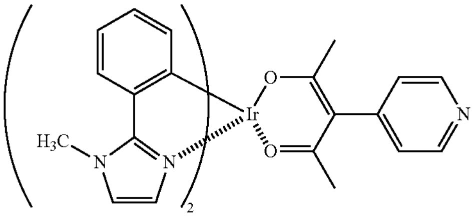
D-62
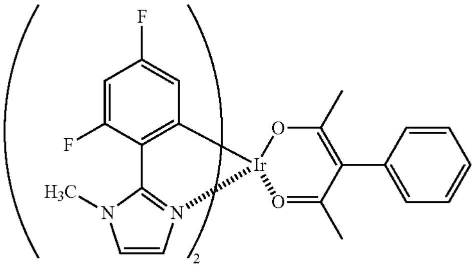
[Formula 18]
D-63
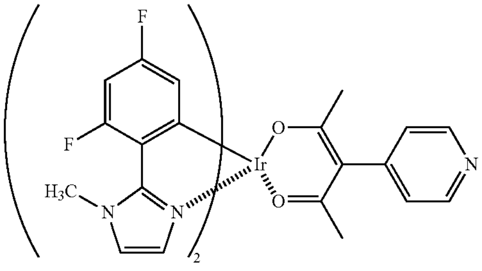
D-64
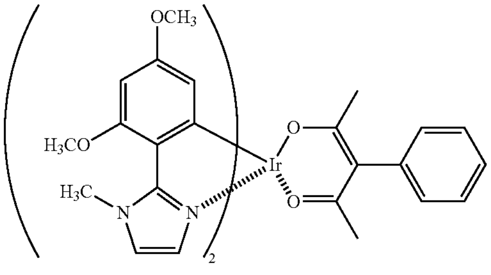
-continued
D-65
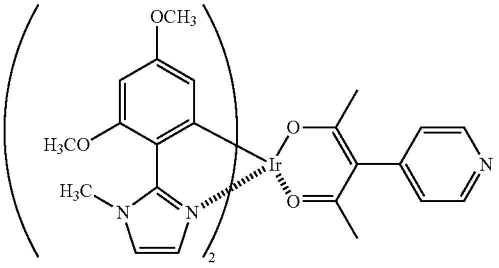
D-66
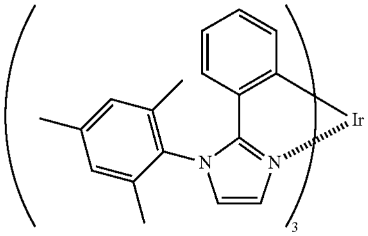
[Formula 19]
D-67
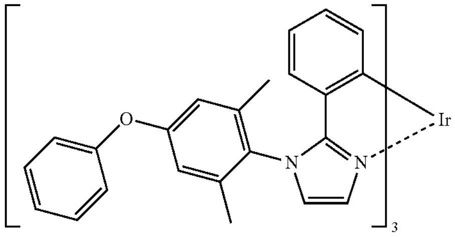
D-68
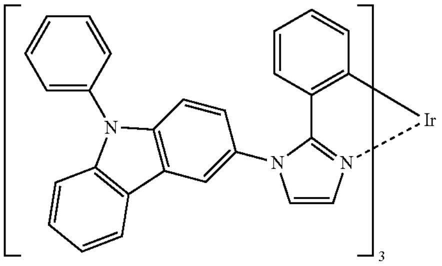
D-69
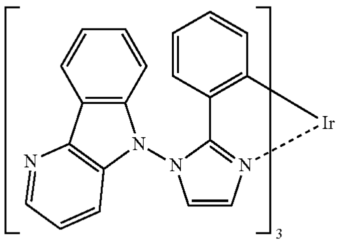
D-70
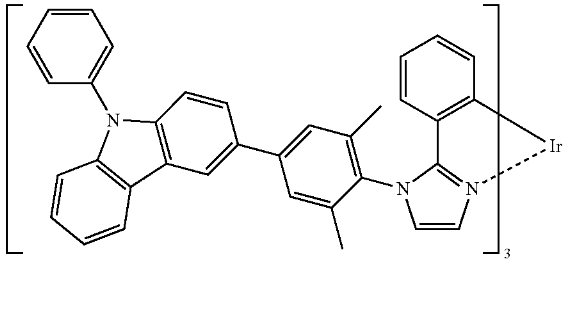

-continued
D-71
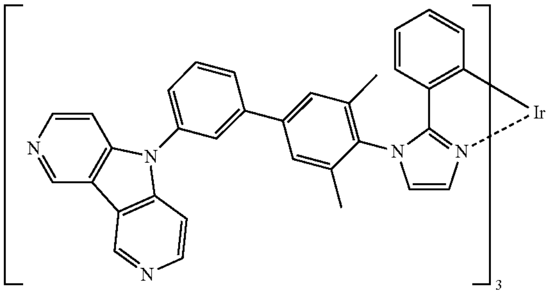
D-72
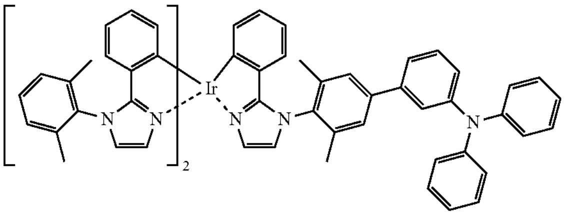
D-73
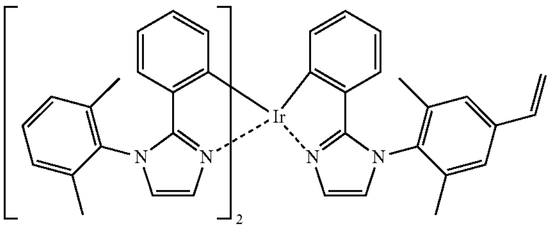
[Formula 20]
D-74
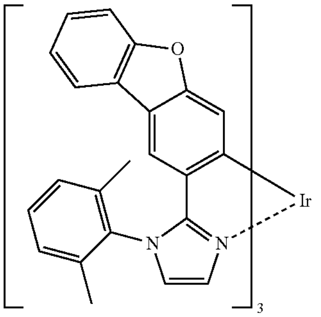
D-75
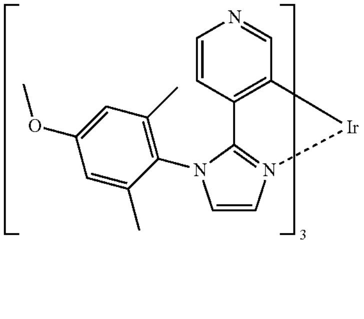
-continued
D-76
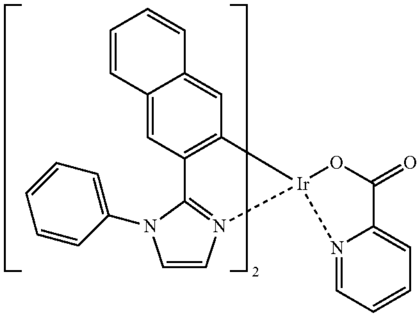
D-77
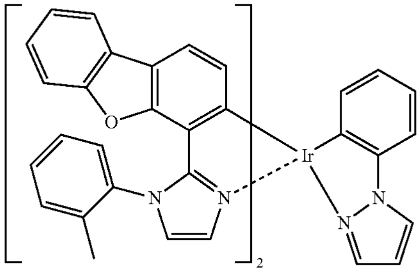
D-78
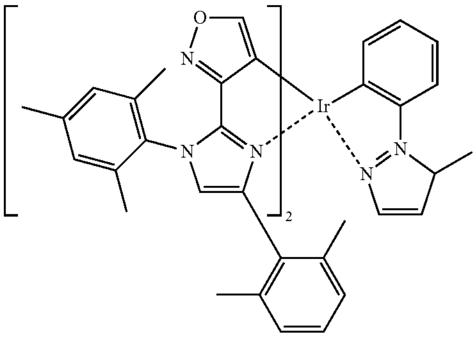
D-79
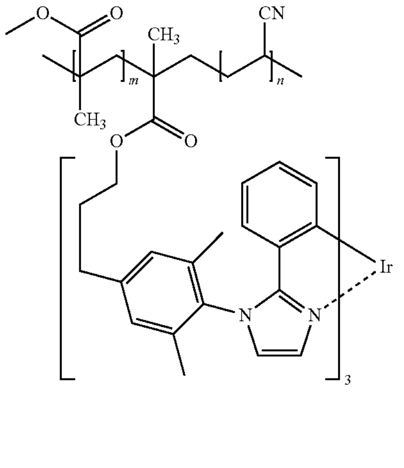

-continued

[Formula 21]

D-80

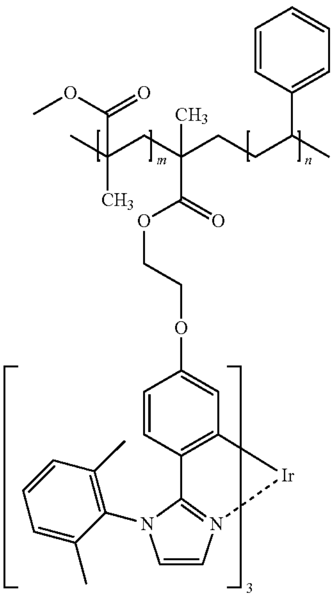

D-81

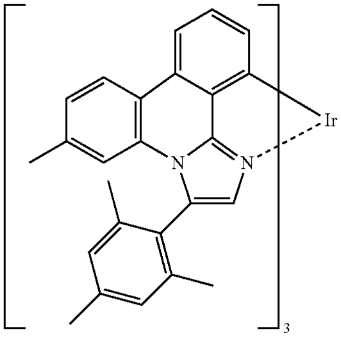

D-82

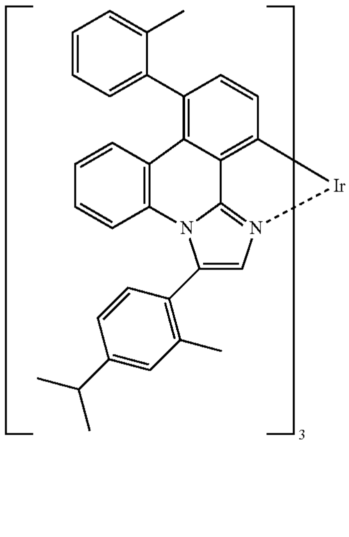

-continued

D-83

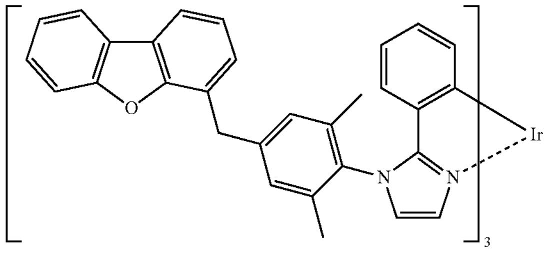

[Formula 22]

D-84

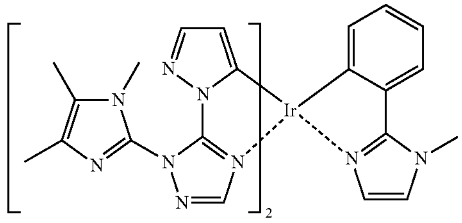

(3) Fluorescence Emission Dopants (Also Called Fluorescent Dopants, Fluorescence Emitters, and the Like)

Examples of fluorescence emission dopants include a coumarin dye, a pyran dye, a cyanine dye, a croconium dye, a squalium dye, an oxobenzanthracene dye, a fluorescein dye, a rhodamine dye, a pyrylium dye, a perylene dye, a stilbene dye, a polythiophene dye, and a rare earth complex fluorescence compound.

<<Injection Layers: Hole Injection Layer and Electron Injection Layer>>

Injection layers are employed as necessary, and may be placed between an anode or an intermediate metal layer and a light emission layer or a hole transport layer, and between a cathode or an intermediate metal layer and a light emission layer or an electron transport layer.

Injection layers are layers that are provided between an electrode/an intermediate metal layer and an organic layer so as to decrease drive voltage and improve emission luminance, as described in detail in volume 2, chapter 2 (pp. 123-166) of "Organic EL Elements and Industrialization Front Thereof (published by N. T. S Corp., Nov. 30, 1998)". Injection layers include a hole injection layer (an anode buffer layer) and an electron injection layer (a cathode buffer layer).

Hole injection layers (anode buffer layers) are also described in detail in JP 9-45479 A, JP 9-260062 A, JP 8-288069 A, and the like, and specific examples of hole injection layers include a phthalocyanine buffer layer such as a copper phthalocyanine layer, an oxide buffer layer such as a vanadium oxide layer, an amorphous carbon buffer layer, and a polymer buffer layer containing a conductive polymer such as polyaniline (emeraldine) or polythiophene. It is also preferable to use a material disclosed in JP 2003-519432 W.

A hole injection layer (or a layer adjacent to the cathode side of the anode and the intermediate metal layer) may be formed by mixing different materials, but in the present invention, it is preferable to form a hole injection layer by forming a film of a single organic compound. This is because, if different materials are mixed and used, the risk of performance variation due to variation in mixing ratio at the time of production, such as density variation in the plane of the film formation substrate, becomes undesirably higher.

The thickness of a hole injection layer is not particularly limited, but is normally 0.1 to 100 nm, and more preferably, 1 to 30 nm.

Examples of preferred materials for an electron injection layer provided between an electron transport layer and a cathode include an alkali metal and an alkali earth metal having work functions of 3 eV or lower, and compounds of those metals. Examples of alkali metal compounds include potassium fluoride, lithium fluoride, sodium fluoride, cesium fluoride, lithium oxide, a lithium quinoline complex, and cesium carbonate. Of these materials, lithium fluoride and cesium carbonate are particularly preferable.

In the present invention, it is preferable not to provide a layer formed with an alkali metal compound or an alkaline earth compound as a layer adjacent to the anode side of an intermediate metal layer.

The thickness of an electron injection layer is not particularly limited, but is normally 0.1 to 10 nm, and more preferably, 0.1 to 2 nm.

<<Inhibition Layers: Hole Inhibition Layer and Electron Inhibition Layer>>

Inhibition layers are provided as necessary. Examples of such inhibition layers are hole inhibition layers (hole block layers) described in JP 11-204258 A, JP 11-204359 A, and page 237 of "Organic EL Elements and Industrialization Front Thereof (published by N. T. S Corp., Nov. 30, 1998)".

A hole inhibition layer, in a broad sense, has the functions of an electron transport layer, is made of a hole inhibition material that has the function to transport electrons while having a very low capability of transporting holes, and can increase the possibility of rebinding of electrons and holes by blocking holes while transporting electrons. Alternatively, the structure of an electron transport layer described layer can be used as a hole inhibition layer where necessary.

A hole inhibition layer in an organic EL element of the present invention is preferably adjacent to a light emission layer.

An electron inhibition layer, in a broad sense, has the functions of a hole transport layer, is made of a material that has a very low capability of transporting electrons while having the function to transport holes, and can increase the possibility of rebinding of electrons and holes by blocking electrons while transporting holes. Alternatively, the structure of a hole transport layer described layer can be used as an electron inhibition layer where necessary.

The thicknesses of a hole inhibition layer and an electron transport layer according to the present invention are preferably 3 to 100 nm, and more preferably, 5 to 30 nm.

<<Hole Transport Layer>>

A hole transport layer is made of a hole transport material having the function to transport holes, and, in a broad sense, a hole injection layer and an electron inhibition layer are also hole transport layers. It is possible to employ one or more hole transport layers.

A hole transport material injects or trans ports holes, or blocks electrons, and may be either an organic material or an inorganic material. Examples of such hole transport materials include a triazole derivative, an oxadiazole derivative, an imidazole derivative, a polyallylalkane derivative, a pyrazoline derivative, a pyrazolone derivative, a phenylenediamine derivative, a allylamine derivative, an amino substituted chalcone derivative, an oxazole derivative, a styrylanthracene derivative, a fluorenone derivative, a hydrazone derivative, a stilbene derivative, a silazane derivative, an aniline copolymer, and a conductive polymer oligomer such as a thiophene oligomer.

Although any of the above materials can be used as a hole transport material, it is preferable to use a porphyrin compound, an aromatic tertiary amine compound, or a styrylamine compound, and it is particularly preferable to use an aromatic tertiary amine compound.

Typical examples of aromatic tertiary amine compounds and styrylamine compounds include N,N,N',N'-tetraphenyl-4,4'-diaminophenyl, N,N'-diphenyl-N,N'-bis(3-methylphenyl)-(1,1'-biphenyl)-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl) phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminophenylether, 4,4'-bis(diphenylamino)quarterphenyl, N,N,N-tri(p-tolyl)amine, 4-(di-p-tolylamino)-4'-[4-(di-p-tri-amino)styryl]stilbene, 4-N,N-diphenylamino-(2-diphenylvinyl)benzene, 3-methoxy-4'-N,N-diphenylaminostilbene, and N-phenylcarbazole. The examples further include compounds each having two condensed aromatic rings in a molecule as described in U.S. Pat. No. 5,061,569, such as 4,4'-bis[N-(1-naphthyl)-N-phenylamino]biphenyl (NPD), and 4,4',4"-tris[N-(3-methylphenyl)-N-phenylamino]triphenylamine (MTDATA), which has three triphenylamine units joined in a star burst form as described in JP 4-308688 A.

Further, it is possible to use a polymer material that has one of the above materials introduced into a polymer chain or has one of the above materials as the main chain of the polymer. Also, it is possible to use an inorganic compound such as p-type Si or p-type SiC as a hole injection material or a hole transport material.

It is also possible to use a hole transport material that has the characteristics of a p-type semiconductor as described in JP 4-297076 A, JP 2000-196140 A, JP 2001-102175 A, J. Appl. Phys., 95, 5773 (2004), JP 11-251067 A, "Applied Physics Letters 80 (2002), p. 139 (J. Huang et al.)", and JP 2003-519432 W. In the present invention, it is preferable to use these materials so as to obtain a light emitting element having higher efficiency.

The thickness of a hole transport layer is not particularly limited, but is normally 5 nm to 5 μm, and more preferably, 5 to 200 nm. The hole transport layer may have a single-layer structure made of one or more of the above described materials.

<<Electron Transport Layer>>

An electron transport layer is made of a material that has the function to transport electrons. It is possible to employ one or more electron transport layers.

An electron transport material that can be used as an electron transport layer has the function to transfer electrons injected via a cathode or an intermediate metal layer to a light emission layer, and can be selected from among conventionally-known compounds. Examples of such materials include a nitro-substituted fluorene derivative, a diphenylquinone derivative, a thiopyrandioxide derivative, a bipyridyl derivative, a fluorenylidenemethane derivative, carbodiimide, anthraquinonedimethane and anthrone derivatives, and an oxadiazole derivative. Further, a thiazole derivative in which an oxygen atom in the oxadiazole ring of the above oxadiazole derivative is substituted by a sulfur atom, or a quinoxaline derivative having a quinoxaline ring known as an electron withdrawing group can also be used as an electron transport material. Further, it is possible to use a polymer material that has one of the above materials introduced into a polymer chain or has one of the above materials as the main chain of the polymer.

In a case where an electron transport layer is placed adjacent to an intermediate metal layer in the present invention, the material is preferably a compound containing a pyridine ring in the structure thereof.

It is also possible to use, as an electron transport material, a metal complex of an 8-quinolinol derivative, such as tris(8-quinolinol)aluminum (Alq), tris(5,7-dichloro-8-quinolinol) aluminum, tris(5,7-dibromo-8-quinolinol)aluminum, tris(2-methyl-8-quinolinol)aluminum, tris(5-methyl-8-quinolinol) aluminum, or bis(8-quinolinol)zinc (Znq), or a metal complex in which a central metal of one of the above metal complexes is substituted with In, Mg, Cu, Ca, Sn, Ga, or Pb. Other than the above, metal-free or metal phthalocyanine, or such a material having its terminal substituted with an alkyl group or a sulfo group or the like can also be suitably used as an electron transport material. A distyrylpyrazine derivative, which has been described as an example material of a light emission layer, can also be used as an electron transport material, and, as in a hole injection layer or a hole transport layer, an inorganic semiconductor such as n-type Si or n-type SiC can also be used as an electron transport material.

An electron transport layer may be formed with a mixture of materials. An electron transport layer may be doped with an alkali metal, an alkali earth metal, an alkali metal compound, or an alkali earth metal compound. However, it is preferable to form an electron transport layer by forming a film of a single organic compound in the present invention. This is because, if different materials are mixed and used, the risk of performance variation due to variation in mixing ratio at the time of production, such as density variation in the plane of the film formation substrate, becomes undesirably higher. As an intermediate metal layer with a low work function is used in the present invention, preferred performance can be achieved without hindering electron injection from an intermediate electrode even though doping with an alkali metal or the like is not performed.

So as to improve high-temperature preserving properties and high-temperature process stability, the glass transition temperature of the organic compound contained in an electron transport layer is preferably 110° C. or higher.

The thickness of an electron transport layer is not particularly limited, but is normally 5 nm to 5 μm, and more preferably, 5 to 200 nm.

<<Supporting Substrate>>

A supporting substrate (hereinafter also referred to as a base, a substrate, a base material, a support, or the like) to be used in an organic EL element of the present invention is not particularly limited to a certain type of glass or plastic, and may be either transparent or non-transparent. In a case where light is extracted from the side of a supporting substrate, the supporting substrate is preferably transparent. Examples of transparent supporting substrates that are preferably used include glass, quartz, and a transparent resin film. A particularly preferable supporting substrate is a resin film that can give flexibility to an organic EL element.

Examples of such resin films include polyesters such as polyethylene terephthalate (PET) and polyethylenenaphthalate (PEN), polyethylene, polypropylene, cellophane, cellulose esters or derivatives thereof such as cellulose diacetate, cellulose triacetate, cellulose acetate butyrate, cellulose acetate propionate (CAP), cellulose acetate phthalate (TAC), and cellulose nitrate, polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyetherimide, polyether ketoneimide, polyamide, fluororesin, nylon, polymethylmethacrylate, acrylic resins, polyarylates, and cycloolefin resins such as ARTON (trade name, manufactured by JSR Corporation) and APEL (trade name, manufactured by Mitsui Chemicals, Inc).

A film of an inorganic material or an organic material, or a hybrid film of both materials may be formed on the surface of the resin film. This film is preferably a barrier film that has a water vapor permeability of 0.01 g/($m^2$·24 h·atm) or lower, which is measured by a method compliant with JIS K 7129-1992. Furthermore, this film is preferably a high barrier film that has an oxygen permeability of $10^{-3}$ g/($m^2$·24 h) or lower, and a water vapor permeability of $10^{-3}$ g/($m^2$·24 h) or lower, which are measured by a method compliant with JIS K 7126-1992. More preferably, both the water vapor permeability and the oxygen permeability are $10^{-5}$ g/($m^2$·24 h) or lower.

The material forming the barrier film is a material that has the function to prevent infiltration of moisture and oxygen that cause deterioration of the element, and such a material may be silicon oxide, silicon dioxide, silicon nitride, or the like. Furthermore, so as to reduce fragility, the barrier film preferably has a stack structure formed with inorganic layers and layers made of an organic material. The order of stacking of inorganic layers and layers made of an organic material is not particularly limited, but it is preferable to alternately stack both kinds of layers several times.

The method of forming the barrier film is not particularly limited, and may be a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, a coating method, or the like. The atmospheric pressure plasma polymerization method described in JP 2004-68143 is also preferable.

Examples of non-transparent supporting substrates include metal plates and films made of aluminum or stainless steel, a non-transparent resin substrate, and a ceramic substrate.

<<Sealing>>

The sealing means used for sealing an organic EL element of the present invention may be a method of bonding a sealing member, an electrode, and a supporting substrate to one another with an adhesive.

The sealing member is placed so as to cover the display region of the organic EL element, and may be in the form of a concave plate or a flat panel. Transparency and electrical insulating properties of the sealing member are not particularly limited.

Specific examples include a glass plate, a polymer plate/film, and a metal plate/film. Examples of glass plates include soda-lime glass, barium and strontium-containing glass, lead glass, aluminosilicic acid glass, borosilicic acid glass, barium borosilicic acid glass, and quartz. Examples of polymer plates may include polycarbonate, acryl, polyethylene terephthalate, polyether sulfide, and polysulfone. Examples of metal plates include plates formed with at least one metal selected from the group consisting of stainless steel, iron, copper, aluminum, magnesium, nickel, zinc, chromium, titanium, molybdenum, silicon, germanium, and tantalum, or an alloy of metals selected from the above group.

In the present invention, so as to form a thinner organic EL element, a polymer film or a metal film is preferably used. Further, the polymer film preferably has an oxygen permeability of $10^{-3}$ g/($m^2$·24 h) or lower, and a water vapor permeability of $10^{-3}$ g/($m^2$·24 h) or lower. More preferably, both the water vapor permeability and the oxygen permeability are $10^{-5}$ g/($m^2$·24 h) or lower.

The sealing member is turned into a concave form by a sandblast process, a chemical etching process, or the like. Specific examples of adhesives include photocurable and thermocurable adhesives having a reactive vinyl group of acrylic acid oligomers and methacrylic acid oligomers, and moisture-curable adhesives such as 2-cyanoacrylic acid ester. The specific examples also include thermal- and chemical-curing (two blended liquids) adhesives such as an epoxy adhesive. The specific examples further include hot-melt type polyamide, polyester, and polyolefin. The specific examples further include ultraviolet-curing epoxy resin adhesives of cationically-curable types.

There are cases where an organic EL element is degraded by a thermal treatment, and therefore, an adhesive that exhibits adhesiveness and curability at temperatures between room temperature and 80° C. is preferable. Also, a desiccant may be dispersed in an adhesive. An adhesive may be applied to a sealing portion by using a commercially-available dispenser or by performing printing such as screen printing.

If there is a space of a gas or liquid phase between a sealing member and the display area of an organic EL element, an inert gas such as nitrogen or argon, or an inert liquid such as fluorinated hydrocarbon or silicone oil is preferably injected into the space. The space may be a vacuum. It is also possible to seal a hygroscopic compound in the space.

Examples of hygroscopic compounds include metal oxides (such as sodium oxide, potassium oxide, calcium oxide, barium oxide, magnesium oxide, and aluminum oxide), sulfates (such as sodium sulfate, calcium sulfate, magnesium sulfate, and cobalt sulfate), metal halides (such as calcium chloride, magnesium chloride, cesium fluoride, tantalum fluoride, cerium bromide, magnesium bromide, barium iodide, and magnesium iodide), and perchlorates (such as barium perchlorate and magnesium perchlorate). In sulfates, metal halides, and perchlorates, anhydrous salts are suitably used.

<<Protective Film and Protective Plate>>

So as to increase mechanical strength of an element, a protective film or a protective plate may be provided on the outer side of the above described sealing film. Particularly, in a case where sealing is performed with the above described sealing film, the mechanical strength thereof is not necessarily high, and therefore, it is preferable to employ a protective film or a protective plate. Materials that can be used for such a protective film or plate include glass plates, polymer plates/films, and metal plates/films, as in the case of the above described sealing. However, so as to forma lighter and thinner element, a polymer film is preferable.

<<Anode>>

An anode containing an electrode material that is a metal, an alloy, or a conductive compound with a high work function (4 eV or higher), or a mixture of those materials, is preferably used as an anode in an organic EL element. Specific examples of such electrode materials include metals such as Au, Ag, and Al, and conductive transparent materials such as CuI, indium tin oxide (ITO), $SnO_2$, and ZnO. It is also possible to use a material that can form an amorphous transparent film, such as IDIXO ($In_2O_3$—ZnO).

So as to form an anode, a thin film of one of the above electrode materials is formed by a method such as a deposition or sputtering method, and a pattern in a desired form may be formed by a photolithography technique. In a case where high patterning precision (100 μm or higher) is not necessary, a pattern may be formed via a mask of a desired shape when the above electrode material is deposited or sputtered. Alternatively, in a case where a coatable material such as an organic conductive compound is used, a wet film forming method such as a printing method or a coating method can be used.

In a case where light emission is obtained from this anode, the transmittance is preferably 10% or higher, and the sheet resistance value of the anode is preferably several hundreds of Ω/□ or lower.

The thickness of the anode varies depending on the material, but is normally 5 to 1000 nm, and more preferably, 5 to 200 nm.

<<Cathode>>

A cathode containing an electrode material that is a metal, an alloy, or a conductive compound, or a mixture of those materials, is preferably used. Specific examples of such electrode materials include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, a rare earth metal, silver, and aluminum. In view of electron injection properties and durability against oxidation or the like, preferable materials among the above materials are mixtures of an electron injecting metal and a second metal that has a higher work function than that of the electron injecting metal and is stable, such as a magnesium/silver mixture, a magnesium/aluminum mixture, a magnesium/indium mixture, an aluminum/aluminum oxide ($Al_2O_3$) mixture, a lithium/aluminum mixture, aluminum, and silver.

A cathode can be manufactured by forming a thin film of one of those electrode materials by a deposition or sputtering method.

The sheet resistance value of such a cathode is preferably several hundreds of Ω/□ or lower, and the thickness is normally 5 nm to 5 μm, and more preferably, 5 to 200 nm.

At least one of the anode and the cathode of an organic EL element should be transparent or semi-transparent, so as to allow emitted light to pass therethrough. With this arrangement, emission luminance becomes desirably higher.

After a film of 1 to 20 nm in thickness is formed with the above described material on the cathode, a film of the conductive transparent material described above in the explanation of the anode is formed thereon. In this manner, a transparent or semi-transparent cathode can be formed. By using this method, an element in which both the anode and the cathode have transmissive properties can be manufactured.

<<Method of Manufacturing an Organic EL Element>>

As an example of a method of manufacturing an organic EL element of the present invention, a method of manufacturing an organic EL element formed with an anode, a first light emitting unit, an intermediate metal layer, a second light emitting unit, and a cathode is now described. The first light emitting unit includes a hole injection layer, a hole transport layer, alight emission layer, and an electron transport layer, in this order from the anode side. The second light emitting unit includes a hole injection layer, a hole transport layer, alight emission layer, an electron transport layer, and an electron injection layer, in this order from the intermediate metal layer side.

First, a thin film made of a desired electrode material such as an anode material is formed on an appropriate supporting substrate by a technique such as vapor deposition or sputtering in such a manner as to have a thickness of 1 μm or smaller, or more preferably, 10 to 200 nm. In this manner, the anode is formed.

The hole injection layer, the hole transport layer, the light emission layer, and the electron transport layer, which constitute the first light emitting unit, is then formed on the anode.

The respective layers constituting the first light emitting unit may be formed by different film forming methods from one another. In a case where a vapor deposition method is employed for film formation, the vapor deposition conditions vary with the type of the compound to be used, but are normally selected from the respective ranges described below. The boat heating temperature is 50 to 450° C., the degree of vacuum is $10^{-6}$ to $10^{-2}$ Pa, the vapor deposition rate is 0.01 to 50 nm/sec, the substrate temperature is −50 to 300° C., and the thickness is 0.1 nm to 5 μm, or more preferably, 5 to 200 nm.

After these layers are formed, a thin film made of an intermediate metal layer is formed on the layers by a vapor deposition method in such a manner as to have a thickness of 0.6 to 5 nm, or more preferably, 0.8 to 3 nm, or even more preferably, 0.8 to 2 nm. As a result, the intermediate metal layer is formed.

The respective layers of the second light emitting unit are then formed in the same manner as in the film formation for the first light emitting unit, and a film of a cathode material is formed by a technique such as vapor deposition or sputtering in such a manner as to have a thickness of 1 μm or smaller, or more preferably, 5 to 200 nm. As a result, the cathode is formed, to complete the desired organic EL element.

The manufacture of the entire organic EL element, starting from the formation of the hole injection layer of the first light emitting unit to the formation of the cathode, may be performed in one-time vacuuming. However, the element being manufactured may be pulled out during the manufacture, and a film may be formed thereon by a different film forming method. In that case, the operation is preferably performed in a dry inert gas atmosphere, to reduce moisture and oxygen damage to the organic EL element.

The manufacturing order may be reversed, and it is possible to form the cathode, the first light emitting unit, the intermediate metal layer, the second light emitting unit, and the anode in this order. In this case, the first light emitting unit includes the electron injection layer, the electron transport layer, the light emission layer, the hole transport layer, and the hole injection layer, in this order from the cathode side, for example. The second light emitting unit includes the electron transport layer, the light emission layer, the hole transport layer, and the hole injection layer, in this order from the intermediate metal layer side, for example.

In a case where a DC voltage is applied to the organic EL element obtained in the above manner, the polarity of the anode is made positive, the polarity of the cathode is made negative, and a voltage of approximately 2 to 40 V is applied. As a result, light emission can be observed. Alternatively, an AC voltage may be applied to the organic EL element. The alternating current to be applied may have any waveform.

<<Technique for Improving Light Extraction>>

It is generally believed that an organic EL element emits light in a layer having a higher refractive index (approximately 1.6 to 2.1) than that of the air, and only 15 to 20% of the light generated in the light emission layer can be extracted. The reasons for the above are as follows: the light that enters an interface (the interface between the transparent substrate and the air) at an angle θ, which is greater than the critical angle, is totally reflected, and no light can be taken out of the element; and the light is totally reflected between the transparent electrode or the light emission layer and the transparent substrate so that the light is guided through the transparent electrode or the light emission layer, and the light is eventually released toward a side surface of the element.

Examples of such methods for increasing light extraction efficiency include: a method by which concavities and convexities are formed in the surface of the transparent substrate so that total reflection at the interface between the transparent substrate and the air is prevented (U.S. Pat. No. 4,774,435, for example); a method by which efficiency is increased by allowing the substrate to have light condensing properties (JP 63-314795 A, for example); a method by which a reflective surface is formed on a side surface of the like of the element (JP 1-220394 A, for example); a method by which a flat layer that has an intermediate refractive index is interposed between the substrate and the light emitter, to form an antireflection film (JP 62-172691 A, for example); a method by which a flat layer that has a lower refractive index than that of the substrate is interposed between the substrate and the light emitter (JP 2001-202827, for example); and a method by which a diffraction grating is formed in an interlayer space between any two of the substrate, the transparent electrode layer, and the light emission layer (including a space between the substrate and the outside) (JP 11-283751 A).

In the present invention, any of the above methods may be employed in combination with an organic EL element of the present invention. However, it is preferable to employ the method by which a flat layer having a lower refractive index than that of the substrate is interposed between the substrate and the light emitter, or the method by which a diffraction grating is formed in an interlayer space between any two of the substrate, the transparent electrode layer, and the light emission layer (including a space between the substrate and the outside).

By combining these methods, the present invention can obtain an element that has even higher luminance or durability.

In a case where a low refractive index medium having a greater thickness than the wavelength of light is formed between the transparent electrode and the transparent substrate, as the refractive index of the medium becomes lower, light released from the transparent electrode has a higher efficiency of extraction to the outside.

The low refractive index layer may be made of aerogel, porous silica, magnesium fluoride, or a fluorine-based polymer. Since the refractive index of the transparent substrate is normally 1.5 to 1.7, the refractive index of the low refractive index layer is preferably 1.5 or lower, and more preferably, 1.35 or lower.

Further, the thickness of the low refractive index medium is preferably at least twice the wavelength in the medium. This is because, if the thickness of the low refractive index medium becomes almost equal to light wavelength, and electromagnetic waves leaking as evernescent waves enter the substrate, the effects of the low refractive index layer become smaller.

The method by which a diffraction grating is placed at an interface that causes total reflection or in a medium characteristically increases light extraction efficiency. According to this method, of light generated from the light emission layer, the light that cannot escape to the outside due to total reflection between layers is diffracted by the diffraction grating placed between layers or in a medium (in the transparent substrate or the transparent electrode), taking advantage of the properties of the diffraction grating that is capable of changing the direction of light to a specified direction different from refraction through so-called Bragg diffraction such as primary diffraction or secondary diffraction. In this manner, light is extracted to the outside.

The diffraction grating to be employed preferably has a two-dimensional cyclic refractive index. Since the light emission layer randomly emits light in all directions, a conventional one-dimensional diffraction grating that has a cyclic refractive index distribution only in a certain direction diffracts only light traveling in a specific direction, and therefore, light extraction efficiency does not dramatically increase.

With a two-dimensional refractive index distribution, on the other hand, light traveling in any direction is diffracted, and light extraction efficiency becomes higher.

The diffraction grating may be placed between layers or in a medium (in the transparent substrate or the transparent electrode), but is preferably located in the vicinity of the organic light emission layer from which light is to be generated. Here, the cycle of the diffraction grating is preferably about ½ to three times the wavelength of the light in the medium. The pattern in the diffraction grating is preferably a two-dimensionally repetitive pattern such as a square lattice pattern, a triangular lattice pattern, or a honeycomb pattern.

In an organic EL element of the present invention, a structure in the form of a microlens array is provided on the light extraction side of the supporting substrate (the substrate), for example, or the element is combined with a so-called light condensing sheet. With this arrangement, luminance in a specific direction can be increased by condensing light in the specific direction such as the front direction with respect to the light emitting surface of the element.

An example of the microlens array is formed by two-dimensionally arranging quadrangular pyramids on the light extraction side of the substrate. Each of the quadrangular pyramids is 30 μm on a side, and has a vertex angle of 90 degrees. The side is preferably 10 to 100 μm. If the side is shorter than the above, diffraction occurs, resulting in undesirable coloring. If the side is too long, the thickness undesirably increases.

As for the light condensing sheet, the one used in the LED backlight of a liquid crystal display device can be used. Examples of such sheets include the luminance enhancing film (BEF), manufactured by Sumitomo 3M Limited.

The prism sheet may be a sheet in which triangular stripes with a vertex angle of 90 degrees are arranged at intervals of 50 μm on the base material, a sheet in which the stripes have rounded vertex, a sheet in which the stripes are arranged at intervals of varying length, or a sheet having some other pattern.

Further, to control the radiation angle of light from the organic EL element, a light diffusion plate/film may be used in conjunction with a light condensing sheet. For example, the light diffusion film (LIGHT-UP), manufactured by Kimoto Co., Ltd., may be used.

<<Display Device>>

A display device in which an organic EL element of the present invention is used is now described.

An organic EL element of the present invention is preferably used in a white light display device. In the case of a white light display device, a shadow mask is provided only at the time of light emission layer formation, and films can be formed on the entire surface by a vapor deposition method, a cast method, a spin coat method, an ink jet method, a printing method, a slot-type coater method, or the like. When patterning is performed only on the light emission layer, the method used for the patterning is not particularly limited, but is preferably a vapor deposition method, an ink jet method, or a printing method. In a case where a vapor deposition method is employed, patterning is preferably performed with the use of a shadow mask.

In a case where a DC voltage is applied to the white light display device obtained in the above manner, the polarity of the anode is made positive, the polarity of the cathode is made negative, and a voltage of approximately 2 to 40 V is applied. As a result, light emission can be observed.

<<Lighting Device>>

A lighting device in which an organic EL element of the present invention is used is now described.

An organic EL element of the present invention may be used as a lamp such as an illuminating or exposure light source, and may also be used as a projection device that projects an image or a display device (a display) on which a still image or a moving image is directly viewed. The drive mode employed in a case where an organic EL element is used as a display device for moving image reproduction may be either a simple matrix (passive matrix) mode or an active matrix mode.

In a white light organic EL element used in the present invention, patterning may be performed with the use of a metal mask or an ink jet printing method at the time of film formation as necessary. When patterning is performed, the patterning may be performed only on the electrode, may be performed on the electrode and the light emission layer, and may be performed on all the layers in the element.

Although the present invention will be described below in detail through Examples, the present invention is not limited to them. In Examples, "part(s)" and "%" represent "vol. %", unless otherwise stated.

The compounds used in the respective Examples have structures shown below.

[Formula 23]

M-1

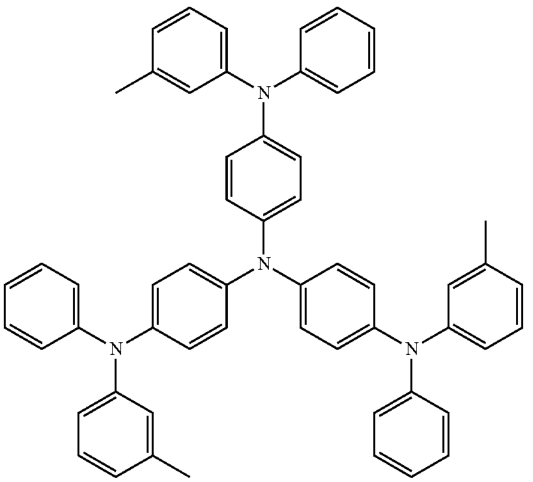

M-2

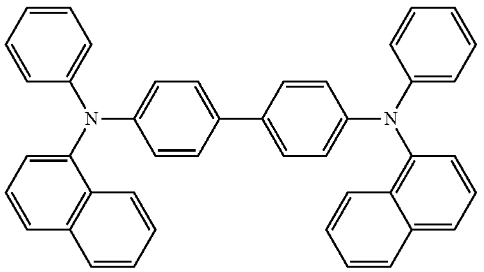

-continued
M-3
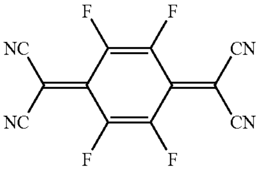
M-4
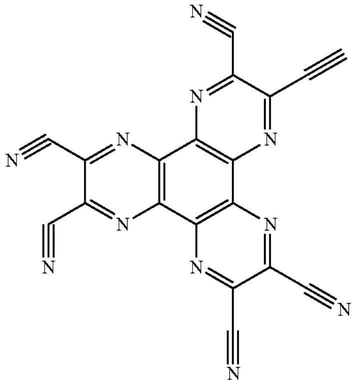
[Formula 24]
BD-1
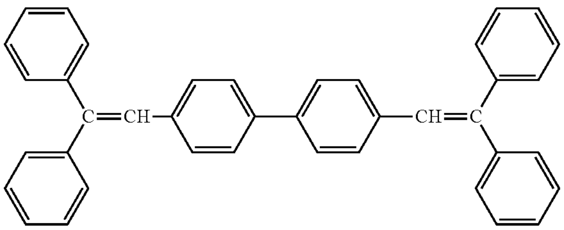
BD-2
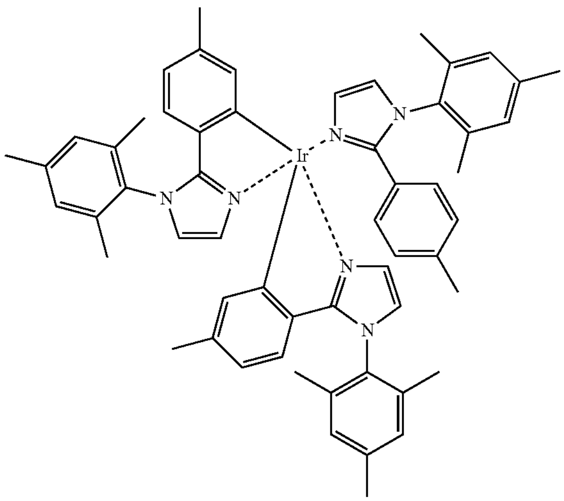
GD-1
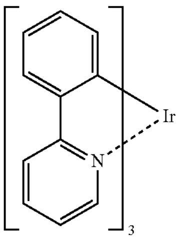
RD-1
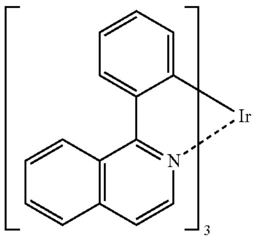
[Formula 25]
H-1
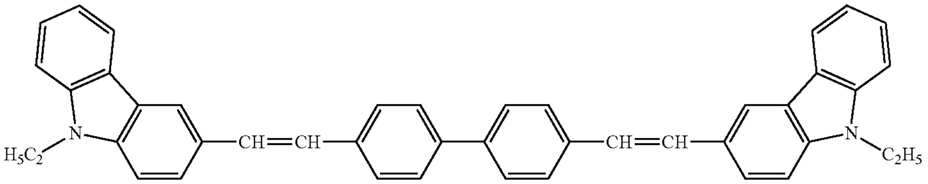

-continued

H-2

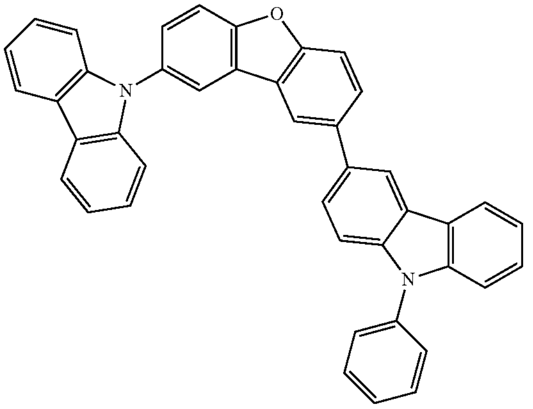

[Formula 26]

E-2

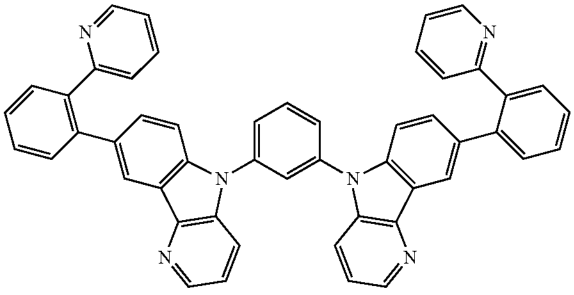

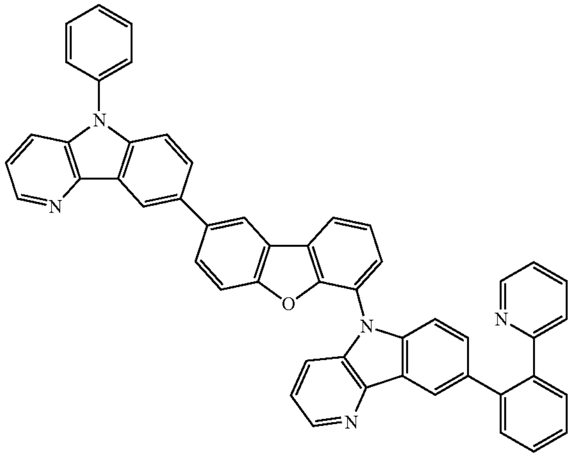

F-1

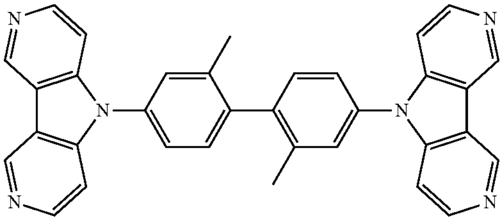

Example 1

Preparation of Organic EL Elements (1) Preparation of an Organic EL Element 101

A 150-nm thick ITO (indium tin oxide) film was formed as an anode on a 30 mm×30 mm glass substrate having a thickness of 0.7 mm, and was subjected to patterning. A transparent supporting substrate to which this ITO transparent electrode was attached was then subjected to ultrasonic cleaning with isopropyl alcohol, was dried with a dry nitrogen gas, and was subjected to UV-ozone cleaning for 5 minutes. This transparent supporting substrate was then secured to the substrate holder of a commercially-available vacuum deposition apparatus.

The optimum amounts of the materials of the respective layers for forming the element were set in the respective vapor deposition boats in the vacuum deposition apparatus. The vapor deposition boats used therein were made of a low-resistance heating material such as molybdenum or tungsten.

After pressure was reduced to a vacuum degree of $1\times10^{-4}$ Pa, the vapor deposition boat carrying a compound M-1 was heated by applying an electric current thereto, so that the compound M-1 was deposited on the transparent supporting substrate at a vapor deposition rate of 0.1 nm/sec, to form a 15-nm thick layer.

A compound M-2 was then deposited in the same manner as above, to form a 50-nm thick layer.

A compound BD-1 and a compound H-1 were then co-deposited at a vapor deposition rate of 0.1 nm/sec, so that the density of the compound BD-1 became 5%. As a result, a blue-light-emitting fluorescence emission layer with a thickness of 35 nm was formed.

A compound E-1 was then deposited at a vapor deposition rate of 0.1 nm/sec, to form a 25-nm thick layer.

Aluminum was then deposited, to form a 6-nm thick intermediate metal layer.

The compound M-2 and a compound M-3 were then co-deposited at a vapor deposition rate of 0.1 nm/sec so that the volume ratio between the compound M-2 and the compound M-3 became 50:50. As a result, a 10-nm thick layer was formed.

The compound M-2 was then deposited at a vapor deposition rate of 0.1 nm/sec, to form a 50-nm thick layer.

Compounds GD-1 and RD-1 and a compound H-2 were then co-deposited at a vapor deposition rate of 0.1 nm/sec, so that the density of the compound GD-1 became 15% and the density of the compound RD-1 became 0.8%. As a result, a yellow-light-emitting phosphorescence emission layer with a thickness of 30 nm was formed.

The compound E-1 was then deposited at a vapor deposition rate of 0.1 nm/sec, to form a 35-nm thick layer.

After a 1.5-nm thick LiF film was formed, aluminum was further deposited, to form a 110-nm cathode.

Figure 2:
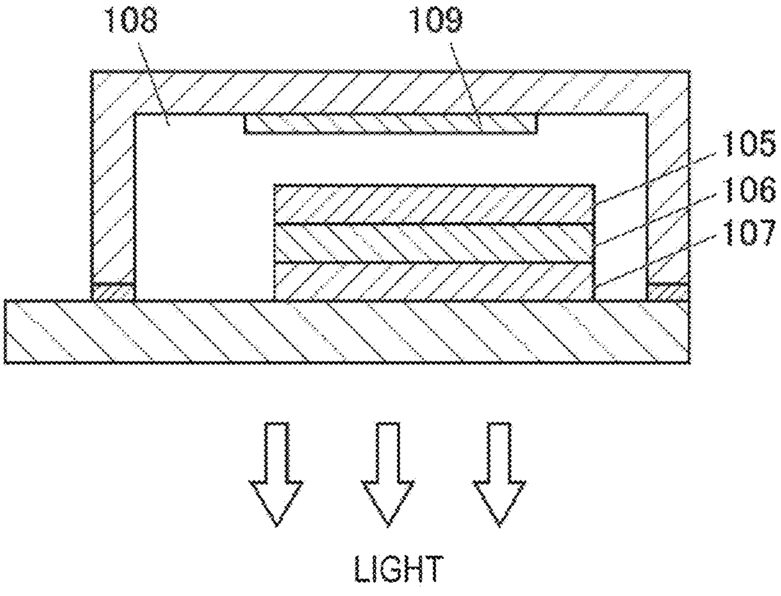
FIG. 2 is a cross-sectional view of an example of a lighting device into which an organic EL element of the present invention is incorporated.

The non-emission surface of the element was then covered with a glass case, to complete the "organic EL element 101" having the structure shown in FIGS. 1 and 2.

FIG. 1 is a schematic view of an organic EL element. As shown in FIG. 1, the organic EL element 101 is covered with a glass cover 102. The sealing operation with the glass cover 102 was performed in a glove box in a nitrogen gas atmosphere (in an atmosphere of a high-purity nitrogen gas of 99.999% or higher in purity) without exposing the organic EL element 101 to the air.

FIG. 2 is a cross-sectional view of the organic EL element. As shown in FIG. 2, an organic EL layer 106 and a cathode 105 are stacked/formed on a glass substrate 107 having a transparent electrode attached thereto. The glass cover 102 is filled with a nitrogen gas 108, and a moisture collector 109 is provided therein.

(2) Preparation of an Organic EL Element 102

An "organic EL element 102" was prepared in the same manner as in the preparation of the organic EL element 101, except that the thickness of the intermediate metal layer was changed to 1 nm.

(3) Preparation of an Organic EL Element 103

An "organic EL element 103" was prepared in the same manner as in the preparation of the organic EL element 101, except that a 1-nm thick LiF layer was formed between the layer formed with the compound E-1 and the intermediate metal layer.

(4) Preparation of an Organic EL Element 104

An "organic EL element 104" was prepared in the same manner as in the preparation of the organic EL element 102, except that a 1-nm thick LiF film was formed between the layer formed with the compound E-1 and the intermediate metal layer.

(5) Preparation of an Organic EL Element 105

An "organic EL element 105" was prepared in the same manner as in the preparation of the organic EL element 101, except that the material forming the intermediate metal layer was changed to Ag.

(6) Preparation of an Organic EL Element 106

An "organic EL element 106" was prepared in the same manner as in the preparation of the organic EL element 102, except that the material forming the intermediate metal layer was changed to Ag.

(7) Preparation of an Organic EL Element 107

An "organic EL element 107" was prepared in the same manner as in the preparation of the organic EL element 102, except that the material forming the intermediate metal layer was changed to Li.

(8) Preparation of an Organic EL Element 108

An "organic EL element 108" was prepared in the same manner as in the preparation of the organic EL element 101, except that the material forming the intermediate metal layer was changed to Ca.

(9) Preparation of an Organic EL Element 109

An "organic EL element 109" was prepared in the same manner as in the preparation of the organic EL element 107, except that the thickness of the intermediate metal layer was 4.5 nm.

(10) Preparation of an Organic EL Element 110

An "organic EL element 110" was prepared in the same manner as in the preparation of the organic EL element 107, except that the thickness of the intermediate metal layer was 2.5 nm.

(11) Preparation of an Organic EL Element 111

An "organic EL element 111" was prepared in the same manner as in the preparation of the organic EL element 107, except that the thickness of the intermediate metal layer was 1.5 nm.

(12) Preparation of an Organic EL Element 112

An "organic EL element 112" was prepared in the same manner as in the preparation of the organic EL element 107, except that the thickness of the intermediate metal layer was 1 nm.

(13) Preparation of an Organic EL Element 113

An "organic EL element 113" was prepared in the same manner as in the preparation of the organic EL element 107, except that the thickness of the intermediate metal layer was 0.7 nm.

(14) Preparation of an Organic EL Element 114

An "organic EL element 114" was prepared in the same manner as in the preparation of the organic EL element 108, except that the thickness of the intermediate metal layer was 1 nm.

(15) Preparation of an Organic EL Element 115

An "organic EL element 115" was prepared in the same manner as in the preparation of the organic EL element 102, except that the material forming the intermediate metal layer was changed to Cs.

(16) Preparation of an Organic EL Element 116

An "organic EL element 116" was prepared in the same manner as in the preparation of the organic EL element 102, except that the material forming the intermediate metal layer was changed to K.

<<Evaluation of Organic EL Elements>>

(1) Measurement of External Luminescence Quantum Efficiencies and Drive Voltages With the use of a spectroradiometer CS-2000 (manufactured by Konica Minolta Sensing Inc.), the front luminance and the luminance angle dependency of each organic EL element were measured at room temperature, so that the amount of light emitted from the front surface of the substrate of each organic EL element to the outside was measured. In this manner, the external luminescence quantum efficiency with an electric current of 2.5 $mA/cm^2$ was calculated, and the drive voltage with the same electric current was measured.

The results of the evaluation are shown in Table 1.

The external luminescence quantum efficiency and the drive voltage of each organic EL element are shown as relative values, with the external luminescence quantum efficiency and the drive voltage of the organic EL element 108 being 100.

TABLE 1

| Sample | Material of layer adjacent to anode side of intermediate metal layer | Intermediate metal layer Material | Intermediate metal layer Thickness (nm) | External luminescence quantum efficiency | Drive voltage | Remarks |
|---|---|---|---|---|---|---|
| 101 | E-1 | Al | 6 | 60 | 160 | Comparative example |
| 102 | E-1 | Al | 1 | 83 | 182 | Comparative example |
| 103 | LiF | Al | 6 | 66 | 133 | Comparative example |
| 104 | LiF | Al | 1 | 84 | 140 | Comparative example |
| 105 | E-1 | Ag | 6 | 73 | 149 | Comparative example |
| 106 | E-1 | Ag | 1 | 87 | 187 | Comparative example |
| 107 | E-1 | Li | 6 | 95 | 93 | Comparative example |
| 108 | E-1 | Ca | 6 | 100 | 100 | Comparative example |
| 109 | E-1 | Li | 4.5 | 111 | 82 | Present invention |
| 110 | E-1 | Li | 2.5 | 120 | 82 | Present invention |
| 111 | E-1 | Li | 1.5 | 126 | 78 | Present invention |
| 112 | E-1 | Li | 1 | 132 | 75 | Present invention |
| 113 | E-1 | Li | 0.7 | 131 | 75 | Present invention |
| 114 | E-1 | Ca | 1 | 120 | 111 | Present invention |
| 115 | E-1 | Cs | 1 | 120 | 78 | Present invention |
| 116 | E-1 | K | 1 | 116 | 78 | Present invention |

(2) Conclusion

As shown in Table 1, the organic EL elements 109 to 116 of the present invention have higher luminescence quantum efficiencies and can operate with lower voltages, compared with the organic EL elements 101 to 108 of comparative examples As can be seen from the above, an intermediate metal layer that is made of a metal with a work function of 3.0 eV of lower and has a thickness of 0.6 to 5 nm is effective in improving luminous efficiency and operating with a low voltage.

Example 2

Preparation of Organic EL Elements (1) Preparation of an Organic EL Element 201

A 150-nm thick ITO (indium tin oxide) film was formed as an anode on a 30 mm×30 mm glass substrate having a thickness of 0.7 mm, and was subjected to patterning. A transparent supporting substrate to which this ITO transparent electrode was attached was then subjected to ultrasonic cleaning with isopropyl alcohol, was dried with a dry nitrogen gas, and was subjected to UV-ozone cleaning for 5 minutes. This transparent supporting substrate was then secured to the substrate holder of a commercially-available vacuum deposition apparatus.

The optimum amounts of the materials of the respective layers for forming the element were set in the respective vapor deposition boats in the vacuum deposition apparatus. The vapor deposition boats used therein were made of a low-resistance heating material such as molybdenum or tungsten.

After pressure was reduced to a vacuum degree of $1\times10^{-4}$ Pa, the vapor deposition boat carrying a compound M-4 was heated by applying an electric current thereto, so that the compound M-4 was deposited on the transparent supporting substrate at a vapor deposition rate of 0.1 nm/sec, to form a 15-nm thick layer.

A compound M-2 was then deposited in the same manner as above, to form a 40-nm thick layer.

A compound BD-1 and a compound H-1 were then co-deposited at a vapor deposition rate of 0.1 nm/sec, so that the density of the compound BD-1 became 5%. As a result, a blue-light-emitting fluorescence emission layer with a thickness of 30 nm was formed.

A compound E-1 was then deposited at a vapor deposition rate of 0.1 nm/sec, to form a 30-nm thick layer.

Lithium was then deposited, to form a 6-nm thick intermediate metal layer.

The compound M-4 was then deposited at a vapor deposition rate of 0.1 nm/sec, to form a 15-nm thick layer.

The compound M-2 was then deposited at a vapor deposition rate of 0.1 nm/sec, to form a 50-nm thick layer.

Compounds GD-1 and RD-1 and a compound H-2 were then co-deposited at a vapor deposition rate of 0.1 nm/sec, so that the density of the compound GD-1 became 17% and the density of the compound RD-1 became 0.8%. As a result, a yellow-light-emitting phosphorescence emission layer with a thickness of 30 nm was formed.

The compound E-1 was then deposited at a vapor deposition rate of 0.1 nm/sec, to form a 30-nm thick layer.

After a 1.5-nm thick LiF film was formed, aluminum was further deposited, to form a 110-nm cathode.

The non-emission surface of the element was then covered with a glass case as in the organic EL element 101, and the "organic EL element 201" having the structure shown in FIGS. 1 and 2 was completed.

(2) Preparation of Organic EL Elements 202 to 207

"Organic EL elements 202 to 207" were prepared in the same manner as in the preparation of the organic EL element 201, except that the thicknesses of the intermediate metal layers were 4.5 nm, 2.5 nm, 1.5 nm, 1 nm, 0.7 nm, and 0.3 nm, respectively.

(3) Preparation of an Organic EL Element 208

An "organic EL element 208" was prepared in the same manner as in the preparation of the organic EL element 201, except that the thickness of the Li film of the intermediate metal layer was 1 nm, and a 1-nm thick film was formed with Li, instead of LiF.

In a case where a stack structure is formed with one intermediate metal layer and one light emitting unit in the organic EL element 208, the layer structure and the materials forming the respective layers in the stack structure are preferably the same as the layer structure and the materials forming the respective layers in another light emitting unit adjacent to the intermediate metal layer side of the stack structure, except for the light emission layer.

More specifically, the layer structure from the layer formed with the compound M-4 to the intermediate metal layer made of lithium and the materials forming the respective layers constituting the light emitting unit are the same as the layer structure from the layer formed with the compound M-4 adjacent to the cathode side of the intermediate metal layer to the layer made of lithium adjacent to the cathode, and the materials forming the respective layers, except for the light emission layer.

With a luminance of 2000 cd/$m^2$, the organic EL elements 201 to 208 emitted white light at a correlated color temperature of 3500 to 4000 K.

<<Evaluation of Organic EL Elements>>

(1) Measurement of External Luminescence Quantum Efficiencies and Drive Voltages External luminescence quantum efficiencies and drive voltages were evaluated in the same manner as in Example 1.

The results of the evaluation are shown in Table 2.

The external luminescence quantum efficiency and the drive voltage of each organic EL element are shown as relative values, with the external luminescence quantum efficiency and the drive voltage of the organic EL element 201 being 100.

(2) Evaluation of Initial Preservation Stabilities

The organic EL elements 201 to 208 prepared as described above were preserved (allowed to stand) in a 90° C. environment for 15 hours, and were then operated at 2.5 mA/$cm^2$. The drive voltages before and after the preservation were measured at room temperature, and the variations were calculated as the indicators of initial preservation stabilities.

The results of the evaluation are shown in Table 2.

The variations of the drive voltages of the respective organic EL elements are shown as relative values, with the variation in the organic EL element 201 being 100.

(3) Long-Term Preservation Stability

The organic EL elements 201 to 208 were preserved (allowed to stand) in a 75° C. environment for 500 hours, and were then operated at 2.5 mA/$cm^2$. The drive voltages and the front luminances before and after the preservation were measured at room temperature, and the variations were calculated as the indicators of long-term preservation stabilities. The front luminances were measured with the use of the spectroradiometer CS-2000 (manufactured by Konica Minolta Sensing Inc.) as in Example 1.

The results of the evaluation are shown in Table 2.

The variations of the drive voltages and the front luminances of the respective organic EL elements are shown as relative values, with the respective variations in the organic EL element 201 being 100.

TABLE 2

| Sample | Intermediate metal layer | | Layer adjacent to cathode | | External luminescence | | Initial preservation stability (90° C., 15 h) | Long-term preservation stability (75° C., 500 h) | | |
|---|---|---|---|---|---|---|---|---|---|---|
| | Material | Thickness (nm) | Material | Thickness (nm) | quantum efficiency | Drive voltage | Drive voltage variation | Drive voltage variation | Luminance variation | Remarks |
| 201 | Li | 6 | LiF | 1.5 | 100 | 100 | 100 | 100 | 100 | Comparative example |
| 202 | Li | 4.5 | LiF | 1.5 | 126 | 97 | 83 | 82 | 30 | Present invention |
| 203 | Li | 2.5 | LiF | 1.5 | 135 | 93 | 83 | 50 | 24 | Present invention |
| 204 | Li | 1.5 | LiF | 1.5 | 140 | 89 | 50 | 35 | 10 | Present invention |
| 205 | Li | 1 | LiF | 1.5 | 143 | 85 | 50 | 28 | 7 | Present invention |
| 206 | Li | 0.7 | LiF | 1.5 | 140 | 83 | 35 | 65 | 18 | Present invention |
| 207 | Li | 0.3 | LiF | 1.5 | 140 | 80 | 155 | 150 | 47 | Comparative example |
| 208 | Li | 1 | Li | 1 | 143 | 85 | 50 | 20 | 5 | Present invention |

(4) Conclusion

As shown in Table 2, the organic EL elements 202 to 206 and 208 including intermediate metal layers with thicknesses according to the present invention have smaller drive voltage variations in both the initial preservation and the long-term preservation, and have smaller luminance variations in the long-term preservation, compared with the organic EL elements 201 and 207 of comparative examples.

Specifically, in the organic EL element 201 of a comparative example that has a thick intermediate metal layer with a thickness of 6 nm, the luminance variation in the long-term preservation is particularly larger than those in the organic EL elements of the present invention. Also, in the organic EL element 207 of a comparative example that has a thin intermediate metal layer with a thickness of 0.3 nm, the luminance variation in the long-term preservation is not much larger than those in the organic EL elements of the present invention, but the drive voltage variation in the initial stage of preservation is particularly large, resulting in a much poorer stability. It is obvious that the preservation stability can be dramatically increased by adjusting the thickness of the intermediate metal layer to a thickness according to the present invention.

In the organic EL element 208, a stack structure is formed with the intermediate layer and a light emitting unit, and the layer structure and the materials forming the respective layers in the stack structure are the same as the layer structure and the materials forming the respective layers in another light emitting unit adjacent to the intermediate metal layer side of the stack structure, except for the light emission layer. This organic EL element 208 exhibits excellent properties, and accordingly, it is apparent that the advantage of a simplified production process can be achieved where the respective light emitting units have the same layer structure and the same materials forming the respective layers, except for the light emission layers.

Example 3

The samples described below were prepared, and the film surface conditions of the intermediate metal layer were observed with a scanning electron microscope.

A 150-nm thick ITO (indium tin oxide) film was formed as an anode on a 30 mm×30 mm glass substrate having a thickness of 0.7 mm, to form a substrate. This substrate was then subjected to ultrasonic cleaning with isopropyl alcohol, was dried with a dry nitrogen gas, and was subjected to UV-ozone cleaning for 5 minutes. This substrate was then secured to the substrate holder of a commercially-available vacuum deposition apparatus.

The optimum amounts of the film forming materials for preparing the respective samples were set in the respective vapor deposition boats in the vacuum deposition apparatus. The vapor deposition boats used therein were made of a low-resistance heating material such as molybdenum or tungsten.

After pressure was reduced to a vacuum degree of $1\times10^{-4}$ Pa, a compound E-1 was deposited at a vapor deposition rate of 0.1 nm/sec, to form a 30-nm thick layer.

Lithium was then deposited to form a film with a desired thickness, and the non-emission surface of the element was covered with a glass case as in the organic EL element 101.

To observe a film surface with an electron microscope, the film sample was detached from the substrate in a nitrogen gas atmosphere to expose the film surface immediately before the glass case was set in the electron microscope.

Figure 3:
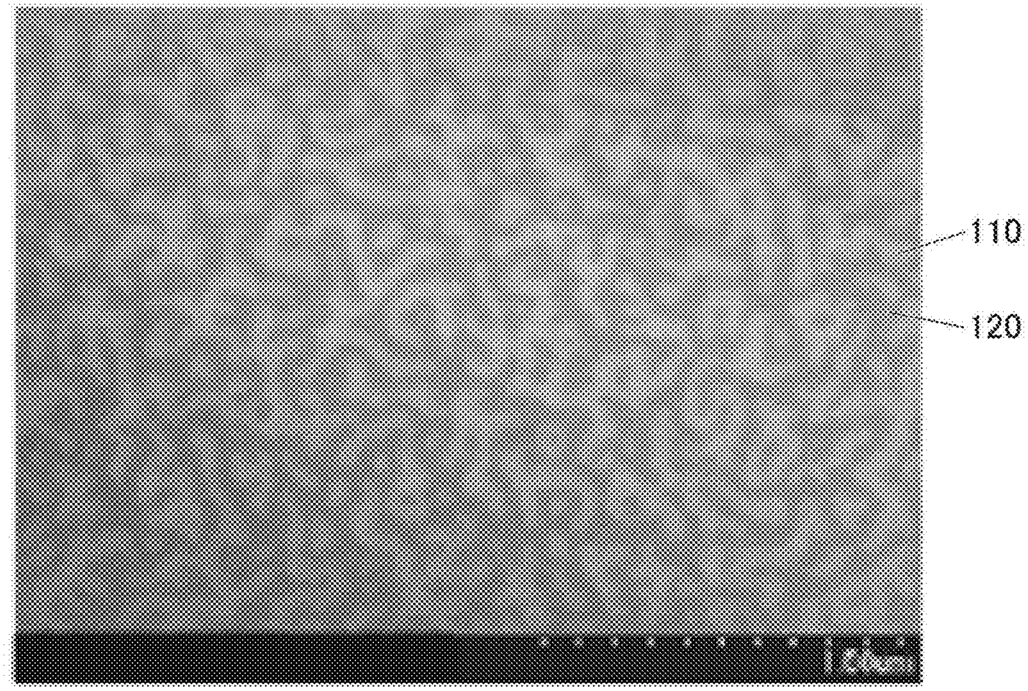
FIG. 3 is a SEM image of an intermediate metal layer of the present invention.

FIG. 3 is an SEM image of a sample having a 1-nm thick lithium film, seen from above. Dot and stripe patterns are observed, and lithium forms a film at bright portions 110. Specifically, the 1-nm thick film of an intermediate metal layer of the present invention has a microstructure formed with regions (bright portions 110) where lithium forms a film, and regions (dark portions 120) where lithium does not form a film or a small amount of lithium exists. In view of this, it is apparent that the film has a non-flat surface.

FIG. 4 is an SEM image of a sample having a 2.5-nm thick lithium film, seen from above. The film surface has dot-like dark portions 120, and is not completely a flat film surface. However, the degree of non-flatness is much lower than that of the 1-nm thick intermediate metal layer shown in FIG. 3.

As can be seen from Example 3, a 1-nm thick intermediate metal layer has higher preservation stability than that of a 2.5-nm thick intermediate metal layer, and the thickness of an intermediate metal layer correlates with the degree of flatness of its film surface.

If the thickness of an intermediate metal layer exceeds 3 nm, such bright and dark patterns are not observed, and the film surface of the intermediate metal layer is flat.

Example 4

Preparation of Organic EL Elements (1) Preparation of an Organic EL Element 401

An "organic EL element 401" was prepared in the same manner as in the preparation of the organic EL element 205, except that, after a layer formed with a compound E-1 was formed adjacent to the fluorescence emission layer, a 1.5-nm thick KF film was formed at a vapor deposition rate of 0.01 nm/sec, and an intermediate metal layer made of lithium was formed.

(2) Preparation of an Organic EL Element 402

An "organic EL element 402" was prepared in the same manner as in the preparation of the organic EL element 205, except that, instead of the layer that was formed with the compound E-1 and was adjacent to the fluorescence emission layer, a film was formed at a vapor deposition rate of 0.1 nm/sec so that the volume ratio between the compound E-1 and KF became 85:15.

(3) Preparation of an Organic EL Element 403

An "organic EL element 403" was prepared in the same manner as in the preparation of the organic EL element 205, except that, instead of the layer that was formed with the compound E-1 and was adjacent to the fluorescence emission layer, a film was formed at a vapor deposition rate of 0.1 nm/sec so that the volume ratio between the compound E-1 and LiF became 80:20.

<<Evaluation of the Organic EL Elements>>

Drive voltages, external luminescence quantum efficiencies, and long-term preservation stabilities were evaluated in the same manner as in Example 2. Table 3 shows relative values, with the respective evaluated values of a certain sample being 100.

The results of the evaluation are shown in Table 3.

The drive voltage, the external luminescence quantum efficiency, and the long-term preservation stability of each organic EL element are shown as relative values, with the drive voltage, the external luminescence quantum efficiency, and the long-term preservation stability of the organic EL element 205 being 100.

TABLE 3

| | Layer adjacent to anode side of intermediate metal layer | | Intermediate metal layer | | External luminescence | | Long-term preservation stability (75° C., 500 h) | | |
|---|---|---|---|---|---|---|---|---|---|
| Sample | Material | Thickness (nm) | Material | Thickness (nm) | quantum efficiency | Drive voltage | Drive voltage variation | Luminance variation | Remarks |
| 205 | E-1 | 30 | Li | 1 | 100 | 100 | 100 | 100 | Present invention |
| 401 | KF | 1.5 | Li | 1 | 93 | 92 | 117 | 125 | Present invention |
| 402 | E-1 + KF | 30 | Li | 1 | 95 | 94 | 111 | 110 | Present invention |
| 403 | E-1 + LiF | 30 | Li | 1 | 95 | 103 | 115 | 115 | Present invention |

As can be seen from Table 3, the organic EL element 205 in which the layer adjacent to the anode side of the intermediate metal layer is a layer formed through formation of a film of a single organic compound excels particularly in long-term preservation stability, compared with the organic EL element 401 in which the adjacent layer is formed with an inorganic compound, and the organic EL elements 402 and 403 in which the adjacent layer is formed with a mixed layer of an organic compound and an inorganic compound.

Example 5

Preparation of Organic EL Elements (1) Preparation of an Organic EL Element 501

An "organic EL element 501" was prepared in the same manner as in the preparation of the organic EL element 205, except that, instead of the layer that was formed with the compound E-1 and was adjacent to the fluorescence emission layer, a layer formed with a compound E-2 was formed.

(2) Preparation of an Organic EL Element 502

An "organic EL element 502" was prepared in the same manner as in the preparation of the organic EL element 501, except that, after the layer formed with the compound E-2 was formed, a 1.5-nm thick KF film was formed at a vapor deposition rate of 0.01 nm/sec, and an intermediate metal layer made of lithium was formed.

<<Evaluation of the Organic EL Elements>>

Drive voltages, external luminescence quantum efficiencies, and long-term preservation stabilities were evaluated in the same manner as in Example 2.

The results of the evaluation are shown in Table 4.

The drive voltage, the external luminescence quantum efficiency, and the long-term preservation stability of each organic EL element are shown as relative values, with the drive voltage, the external luminescence quantum efficiency, and the long-term preservation stability of the organic EL element 501 being 100.

TABLE 4

| | Layer adjacent to anode side of intermediate metal layer | | Intermediate metal layer | | External luminescence | | Long-term preservation stability (75° C., 500 h) | | |
|---|---|---|---|---|---|---|---|---|---|
| Sample | Material | Thickness (nm) | Material | Thickness (nm) | quantum efficiency | Drive voltage | Drive voltage variation | Luminance variation | Remarks |
| 501 | E-2 | 30 | Li | 1 | 100 | 100 | 100 | 100 | Present invention |
| 502 | KF | 1.5 | Li | 1 | 93 | 94 | 122 | 118 | Present invention |

As can be seen from Table 4, among the elements in which the material of the layer adjacent to the anode side of the intermediate metal layer is the compound E-2, instead of the compound E-1, the organic EL element 501 in which the adjacent layer is a layer formed through formation of a film of a single organic compound excels in long-term preservation stability, compared with the organic EL element 502 in which the adjacent layer is formed with an inorganic compound.

Example 6

Preparation of Organic EL Elements (1) Preparation of an Organic EL Element 601

A 150-nm thick ITO (indium tin oxide) film was formed as an anode on a 30 mm×30 mm glass substrate having a thickness of 0.7 mm, and was subjected to patterning. A transparent supporting substrate to which this ITO transparent electrode was attached was then subjected to ultrasonic cleaning with isopropyl alcohol, was dried with a dry nitrogen gas, and was subjected to UV-ozone cleaning for 5 minutes. This transparent supporting substrate was then secured to the substrate holder of a commercially-available vacuum deposition apparatus.

The optimum amounts of the materials of the respective layers for forming the element were set in the respective vapor deposition boats in the vacuum deposition apparatus. The vapor deposition boats used therein were made of a low-resistance heating material such as molybdenum or tungsten.

After pressure was reduced to a vacuum degree of $1\times10^{-4}$ Pa, the vapor deposition boat carrying a compound M-4 was heated by applying an electric current thereto, so that the compound M-4 was deposited on the transparent supporting substrate at a vapor deposition rate of 0.1 nm/sec, to form a 15-nm thick layer.

A compound M-2 was then deposited in the same manner as above, to form a 50-nm thick layer.

Compounds GD-1 and RD-1 and a compound H-2 were then co-deposited at a vapor deposition rate of 0.1 nm/sec, so that the density of the compound GD-1 became 12% and the density of the compound RD-1 became 1.5%. As a result, a yellow-light-emitting phosphorescence emission layer with a thickness of 12 nm was formed.

A compound BD-2 and a compound H-2 were then co-deposited at a vapor deposition rate of 0.1 nm/sec, so that the density of the compound BD-2 became 12%. As a result, a blue-light-emitting phosphorescence emission layer with a thickness of 20 nm was formed.

A compound F-1 was then deposited at a vapor deposition rate of 0.1 nm/sec, to form a 5-nm layer. Further, a compound E-1 was deposited at a vapor deposition rate of 0.1 nm/sec, to form a 30-nm thick layer.

Lithium was then deposited, to form a 6-nm thick intermediate metal layer.

The film formation process from the compound M-4 to the compound E-2 was repeated once, and a 1-nm thick lithium film was further formed. After that, aluminum was deposited, to form a 110-nm thick cathode.

The non-emission surface of the element was then covered with a glass case as in the organic EL element 101, and the "organic EL element 601" having the structure shown in FIGS. 1 and 2 was completed.

(2) Preparation of an Organic EL Element 602

An "organic EL element 602" was prepared in the same manner as in the preparation of the organic EL element 601, except that the thickness of the intermediate metal layer was 1 nm.

(3) Preparation of an Organic EL Element 603

An "organic EL element 603" was prepared in the same manner as in the preparation of the organic EL element 601, except that the thickness of the intermediate metal layer was 0.4 nm.

With a front luminance of 1000 cd/$m^2$, each of the above organic EL elements emitted white light at a correlated color temperature of approximately 2800 K.

<<Evaluation of the Organic EL Elements>>

Drive voltages, external luminescence quantum efficiencies, and preservation stabilities were evaluated in the same manner as in Example 2, and the results of the evaluation on the relationships between the thicknesses of the intermediate metal layers and the respective properties are similar to those in Example 2. This confirms that the present invention is also effective in organic EL elements in which all the light emission materials are phosphorescence emission materials.

Example 7

Preparation of Organic EL Elements (1) Preparation of an Organic EL Element 701

A 150-nm thick ITO (indium tin oxide) film was formed as an anode on a 30 mm×30 mm glass substrate having a thickness of 0.7 mm, and was subjected to patterning. A transparent supporting substrate to which this ITO transparent electrode was attached was then subjected to ultrasonic cleaning with isopropyl alcohol, was dried with a dry nitrogen gas, and was subjected to UV-ozone cleaning for 5 minutes. This transparent supporting substrate was then secured to the substrate holder of a commercially-available vacuum deposition apparatus.

The optimum amounts of the materials of the respective layers for forming the element were set in the respective vapor deposition boats in the vacuum deposition apparatus. The vapor deposition boats used therein were made of a low-resistance heating material such as molybdenum or tungsten.

After pressure was reduced to a vacuum degree of $1\times10^{-4}$ Pa, the vapor deposition boat carrying a compound M-4 was heated by applying an electric current thereto, so that the compound M-4 was deposited on the transparent supporting substrate at a vapor deposition rate of 0.1 nm/sec, to form a 15-nm thick layer.

A compound M-2 was then deposited in the same manner as above, to form a 50-nm thick layer.

A compound GD-1 and a compound H-2 were then co-deposited at a vapor deposition rate of 0.1 nm/sec, so that the density of the compound GD-1 became 9%. As a result, a green-light-emitting phosphorescence emission layer with a thickness of 30 nm was formed.

A compound E-1 was then deposited at a vapor deposition rate of 0.1 nm/sec, to form a 15-nm thick layer.

Lithium was then deposited, to form a 6-nm thick first intermediate metal layer.

A 15-nm thick layer formed with the compound M-4 and a 40-nm thick layer formed with the compound M-2 were then formed in the same manner as above.

The compounds GD-1 and RD-1 and the compound H-2 were then co-deposited at a vapor deposition rate of 0.1 nm/sec, so that the density of the compound GD-1 became 8% and the density of the compound RD-1 became 1.5%. As a result, a red-light-emitting phosphorescence emission layer with a thickness of 25 nm was formed.

The compound E-1 was then deposited at a vapor deposition rate of 0.1 nm/sec, to form a 25-nm thick layer.

Lithium was then deposited, to form a 6-nm thick second intermediate metal layer.

A 15-nm thick layer formed with the compound M-4 and a 40-nm thick layer formed with the compound M-2 were then formed in the same manner as above.

A compound BD-1 and a compound H-1 were then co-deposited at a vapor deposition rate of 0.1 nm/sec, so that the density of the compound BD-1 became 5%. As a result, a blue-light-emitting fluorescence emission layer with a thickness of 25 nm was formed.

The compound E-1 was then deposited at a vapor deposition rate of 0.1 nm/sec, to form a 35-nm thick layer.

After a 1-nm thick lithium film was formed, aluminum was further deposited, to form a 110-nm cathode.

The non-emission surface of the element was then covered with a glass case as in the organic EL element 101, and the "organic EL element 701" having the structure shown in FIGS. 1 and 2 was completed.

The organic EL element 701 is an element that includes intermediate metal layers at two sites.

(2) Preparation of an Organic EL Element 702

An "organic EL element 702" was prepared in the same manner as in the preparation of the organic EL element 701, except that the thickness of the first and second intermediate metal layers was 1 nm.

(3) Preparation of an Organic EL Element 703

An "organic EL element 703" was prepared in the same manner as in the preparation of the organic EL element 701, except that the thickness of the first and second intermediate metal layers was 0.4 nm.

<<Evaluation of the Organic EL Elements>>

Drive voltages, external luminescence quantum efficiencies, and preservation stabilities were evaluated in the same manner as in Example 2, and the results of the evaluation on the relationships between the thicknesses of the intermediate metal layers and the respective properties are similar to those in Example 2. This confirms that the present invention is also effective in organic EL elements in which intermediate metal layers are provided at two or more sites.

REFERENCE SIGNS LIST

101 Organic EL element
102 Glass cover
105 Cathode
106 Organic EL layer
107 Glass substrate with transparent electrode
108 Nitrogen gas
109 Moisture collector
110 Bright portion
120 Dark portion

The invention claimed is:

1. An organic electroluminescence element comprising:
at least one intermediate metal layer; and
at least two light emitting units between an anode and a cathode, wherein
the intermediate metal layer is located between the two light emitting units,
the intermediate metal layer is made of a metal with a work function of 3.0 eV or lower and has a thickness of 0.6 to 5 nm,
at least one of surfaces of the intermediate metal layer is a non-flat surface, and
the surfaces face the light emitting units.

2. The organic electroluminescence element according to claim 1, wherein a layer adjacent to the anode side of the intermediate metal layer is formed with a single organic compound.

3. The organic electroluminescence element according to claim 1, wherein a layer adjacent to the anode side of the intermediate metal layer is formed by forming a film of a single organic compound.

4. The organic electroluminescence element according to claim 1, wherein
a stack structure is formed with the intermediate metal layer and the light emitting unit, and
a layer structure and materials forming respective layers in the stack structure are the same as a layer structure and materials forming respective layers in another light emitting unit or another stack structure adjacent to the intermediate metal layer side of the stack structure, except for a light emission layer.

5. The organic electroluminescence element according to claim 1, which emits white light.

6. The organic electroluminescence element according to claim 1, wherein a layer adjacent to the anode side of the intermediate metal layer is formed with a single organic compound.

7. The organic electroluminescence element according to claim 1, wherein a layer adjacent to the anode side of the intermediate metal layer is formed by forming a film of a single organic compound.

8. The organic electroluminescence element according to claim 1, wherein
a stack structure is formed with the intermediate metal layer and the light emitting unit, and
a layer structure and materials forming respective layers in the stack structure are the same as a layer structure and materials forming respective layers in another light emitting unit or another stack structure adjacent to the intermediate metal layer side of the stack structure, except for a light emission layer.

9. The organic electroluminescence element according to claim 1, which emits white light.

10. The organic electroluminescence element according to claim 2, wherein
a stack structure is formed with the intermediate metal layer and the light emitting unit, and
a layer structure and materials forming respective layers in the stack structure are the same as a layer structure and materials forming respective layers in another light emitting unit or another stack structure adjacent to the intermediate metal layer side of the stack structure, except for a light emission layer.

11. The organic electroluminescence element according to claim 2, which emits white light.

12. The organic electroluminescence element according to claim 3, wherein
a stack structure is formed with the intermediate metal layer and the light emitting unit, and
a layer structure and materials forming respective layers in the stack structure are the same as a layer structure and materials forming respective layers in another light emitting unit or another stack structure adjacent to the intermediate metal layer side of the stack structure, except for a light emission layer.

13. The organic electroluminescence element according to claim 3, which emits white light.

14. The organic electroluminescence element according to claim 4, which emits white light.

* * * * *